(12) United States Patent
Hajimiri et al.

(10) Patent No.: US 10,749,593 B2
(45) Date of Patent: Aug. 18, 2020

(54) SYSTEMS AND METHODS FOR CONTROLLING SUPPLY VOLTAGES OF STACKED POWER AMPLIFIERS

(71) Applicant: California Institute of Technology, Pasadena, CA (US)

(72) Inventors: Seyed Ali Hajimiri, La Canada, CA (US); Florian Bohn, Pasadena, CA (US); Behrooz Abiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 776 days.

(21) Appl. No.: 15/233,830

(22) Filed: Aug. 10, 2016

(65) Prior Publication Data

US 2017/0047463 A1   Feb. 16, 2017

Related U.S. Application Data

(60) Provisional application No. 62/366,720, filed on Jul. 26, 2016, provisional application No. 62/352,392, (Continued)

(51) Int. Cl.
*H03F 3/04* (2006.01)
*H04B 7/185* (2006.01)
(Continued)

(52) U.S. Cl.
CPC ......... *H04B 7/18513* (2013.01); *B64G 1/428* (2013.01); *H02S 40/30* (2014.12); (Continued)

(58) Field of Classification Search
CPC ...... H03F 3/45183; H03F 3/68; H03F 1/0261; H03F 3/245; H03F 3/45192
(Continued)

(56) References Cited

U.S. PATENT DOCUMENTS 2,599,944 A   6/1952   Salisbury et al.
3,152,260 A   10/1964   Cummings
(Continued)

FOREIGN PATENT DOCUMENTS

CA   2833826 A1   11/2012
CA   2833862 A1   5/2014
(Continued)

OTHER PUBLICATIONS

International Preliminary Report on Patentability for International Application PCT/US2015/030900, dated Nov. 15, 2016, dated Nov. 24, 2016, 9 Pgs.
(Continued)

*Primary Examiner* — Khanh V Nguyen
*Assistant Examiner* — Khiem D Nguyen
(74) *Attorney, Agent, or Firm* — KPPB LLP

(57) ABSTRACT

Many embodiments of the invention include stacked power amplifier configurations that include control circuitry for sensing the operational characteristics of the power amplifiers and adjusting the current drawn by one or more of the power amplifiers to prevent any of the power amplifiers from experiencing over voltage stresses and/or to increase the operational efficiency of the power amplifiers.

21 Claims, 21 Drawing Sheets

Related U.S. Application Data filed on Jun. 20, 2016, provisional application No. 62/340,644, filed on May 24, 2016, provisional application No. 62/330,341, filed on May 2, 2016, provisional application No. 62/320,819, filed on Apr. 11, 2016, provisional application No. 62/295,947, filed on Feb. 16, 2016, provisional application No. 62/270,425, filed on Dec. 21, 2015, provisional application No. 62/268,632, filed on Dec. 17, 2015, provisional application No. 62/264,500, filed on Dec. 8, 2015, provisional application No. 62/239,706, filed on Oct. 9, 2015, provisional application No. 62/220,017, filed on Sep. 17, 2015, provisional application No. 62/203,159, filed on Aug. 10, 2015.

(51) Int. Cl.
| | |
|---|---|
| *H03F 3/19* | (2006.01) |
| *H02S 40/30* | (2014.01) |
| *H03F 3/68* | (2006.01) |
| *H03F 1/02* | (2006.01) |
| *H03F 3/45* | (2006.01) |
| *H03F 3/24* | (2006.01) |
| *B64G 1/42* | (2006.01) |
| *H04B 7/06* | (2006.01) |
| *H04L 25/08* | (2006.01) |
| *H04L 27/152* | (2006.01) |
| *H04L 27/26* | (2006.01) |

(52) U.S. Cl.
CPC .............. *H03F 1/0261* (2013.01); *H03F 3/19* (2013.01); *H03F 3/245* (2013.01); *H03F 3/45183* (2013.01); *H03F 3/45192* (2013.01); *H03F 3/68* (2013.01); *H04B 7/0617* (2013.01); *H04L 25/085* (2013.01); *H04L 27/152* (2013.01); *H04L 27/261* (2013.01); *H03F 2200/451* (2013.01); *H03F 2200/462* (2013.01); *H03F 2200/471* (2013.01); *H03F 2203/45731* (2013.01); *Y02D 70/164* (2018.01); *Y02D 70/166* (2018.01); *Y02D 70/446* (2018.01)

(58) Field of Classification Search
USPC .................................................. 330/297, 129
See application file for complete search history.

(56) References Cited

U.S. PATENT DOCUMENTS

| | | |
|---|---|---|
| 3,419,433 A | 12/1968 | Slifer, Jr. |
| 3,427,200 A | 2/1969 | Lapin et al. |
| 3,433,677 A | 3/1969 | Robinson et al. |
| 3,437,527 A | 4/1969 | Webb |
| 3,457,427 A | 7/1969 | Tarneja et al. |
| 3,489,915 A | 1/1970 | Engelhardt et al. |
| 3,530,009 A | 9/1970 | Linkous et al. |
| 3,532,299 A | 10/1970 | Williamson et al. |
| 3,562,020 A | 2/1971 | Blevins |
| 3,611,652 A | 10/1971 | Rabenhorst et al. |
| 3,616,528 A | 11/1971 | Goldsmith et al. |
| 3,627,585 A | 12/1971 | Dollery et al. |
| 3,636,539 A | 1/1972 | Gaddy |
| 3,698,958 A | 10/1972 | Williamson et al. |
| 3,730,457 A | 5/1973 | Williams et al. |
| 3,735,943 A | 5/1973 | Fayet et al. |
| 3,758,051 A | 9/1973 | Williams |
| 3,781,647 A | 12/1973 | Glaser |
| 3,785,590 A | 1/1974 | Wentworth |
| 3,793,082 A | 2/1974 | Roger |
| 3,805,622 A | 4/1974 | Kinard |
| 3,809,337 A | 5/1974 | Andrews et al. |
| 3,817,477 A | 6/1974 | Luther et al. |
| 3,848,821 A | 11/1974 | Scheel |
| 3,863,870 A | 2/1975 | Andrews et al. |
| 3,952,324 A | 4/1976 | Wolff et al. |
| 3,989,994 A | 11/1976 | Brown |
| 4,078,747 A | 3/1978 | Minovitch |
| 4,116,258 A | 9/1978 | Slysh et al. |
| 4,133,501 A | 1/1979 | Pentlicki |
| 4,151,872 A | 5/1979 | Slysh et al. |
| 4,153,474 A | 5/1979 | Rex |
| 4,155,524 A | 5/1979 | Marello et al. |
| 4,166,919 A | 9/1979 | Carlson |
| 4,234,856 A | 11/1980 | Jung et al. |
| 4,282,394 A | 8/1981 | Lackey et al. |
| 4,328,389 A | 5/1982 | Stern et al. |
| 4,415,759 A | 11/1983 | Copeland et al. |
| 4,416,052 A | 11/1983 | Stern |
| 4,419,532 A | 12/1983 | Severns |
| 4,687,880 A | 8/1987 | Morris |
| 4,735,488 A | 4/1988 | Rancourt et al. |
| 4,780,726 A | 10/1988 | Archer et al. |
| 4,784,700 A | 11/1988 | Stern et al. |
| 4,789,989 A | 12/1988 | Stern et al. |
| 4,850,031 A * | 7/1989 | Allsop ................ A63B 29/021 455/500 |
| 4,947,825 A | 8/1990 | Moriarty |
| 4,953,190 A | 8/1990 | Kukoleck et al. |
| 5,013,128 A | 5/1991 | Stern et al. |
| 5,114,101 A | 5/1992 | Stern et al. |
| 5,131,955 A | 7/1992 | Stern et al. |
| 5,154,777 A | 10/1992 | Blackmon et al. |
| 5,177,396 A | 1/1993 | Gielen et al. |
| 5,180,441 A | 1/1993 | Cornwall et al. |
| 5,226,107 A | 7/1993 | Stern et al. |
| 5,280,441 A | 1/1994 | Wada et al. |
| 5,309,925 A | 5/1994 | Policastro |
| 5,310,141 A | 5/1994 | Homer et al. |
| 5,337,980 A | 8/1994 | Homer et al. |
| 5,344,496 A | 9/1994 | Stern et al. |
| 5,404,868 A | 4/1995 | Sankrithi |
| 5,428,483 A | 6/1995 | Sato et al. |
| 5,487,791 A | 1/1996 | Everman et al. |
| 5,496,414 A | 3/1996 | Harvey et al. |
| 5,512,913 A | 4/1996 | Staney |
| 5,520,747 A | 5/1996 | Marks |
| 5,569,332 A | 10/1996 | Glatfelter et al. |
| 5,623,119 A | 4/1997 | Yater et al. |
| 5,653,222 A | 8/1997 | Newman |
| 5,666,127 A | 9/1997 | Kochiyama et al. |
| 5,785,280 A | 7/1998 | Baghdasarian |
| 5,885,367 A | 3/1999 | Brown et al. |
| 5,909,299 A | 6/1999 | Sheldon, Jr. et al. |
| 5,909,860 A | 6/1999 | Lee et al. |
| 5,969,695 A | 10/1999 | Bassily et al. |
| 5,984,484 A | 11/1999 | Kruer |
| 6,017,002 A | 1/2000 | Burke et al. |
| 6,031,178 A | 2/2000 | Kester |
| 6,043,425 A | 3/2000 | Assad |
| 6,050,526 A | 4/2000 | Stribling |
| 6,060,790 A | 5/2000 | Craig, Jr. |
| 6,091,017 A | 7/2000 | Stern |
| 6,118,067 A | 9/2000 | Lashley et al. |
| 6,150,995 A | 11/2000 | Gilger |
| 6,188,012 B1 | 2/2001 | Ralph |
| 6,194,790 B1 | 2/2001 | Griffin et al. |
| 6,195,067 B1 | 2/2001 | Gilger |
| 6,284,967 B1 | 9/2001 | Hakan et al. |
| 6,300,558 B1 | 10/2001 | Takamoto et al. |
| 6,343,442 B1 | 2/2002 | Marks |
| 6,366,255 B1 | 4/2002 | Chiang |
| 6,366,256 B1 | 4/2002 | Ramanujam et al. |
| 6,369,545 B1 | 4/2002 | Williams et al. |
| 6,394,395 B1 | 5/2002 | Poturalski et al. |
| 6,423,895 B1 | 7/2002 | Murphy et al. |
| 6,429,368 B1 | 8/2002 | Summers |
| 6,528,716 B2 | 3/2003 | Collette et al. |
| 6,534,705 B2 | 3/2003 | Berrios et al. |
| 6,541,916 B2 | 4/2003 | Decker |
| 6,547,190 B1 | 4/2003 | Thompson et al. |

(56) References Cited

U.S. PATENT DOCUMENTS

| | | |
|---|---|---|
| 6,555,740 B2 | 4/2003 | Roth et al. |
| 6,557,804 B1 | 5/2003 | Carroll |
| 6,560,942 B2 | 5/2003 | Warren et al. |
| 6,565,044 B1 | 5/2003 | Johnson et al. |
| 6,577,130 B1 | 6/2003 | Adamo et al. |
| 6,587,263 B1 | 7/2003 | Iacovangelo et al. |
| 6,590,150 B1 | 7/2003 | Kiefer |
| 6,635,507 B1 | 10/2003 | Boutros et al. |
| 6,655,638 B2 | 12/2003 | Deel |
| 6,660,927 B2 | 12/2003 | Zwanenburg |
| 6,660,928 B1 | 12/2003 | Patton et al. |
| 6,689,952 B2 | 2/2004 | Kawaguchi |
| 6,690,252 B2 | 2/2004 | Scoltock, Jr. et al. |
| 6,713,670 B2 | 3/2004 | Stern et al. |
| 6,735,838 B1 | 5/2004 | Triller et al. |
| 6,735,920 B1 | 5/2004 | Cadogan |
| 6,768,048 B2 | 7/2004 | Woll et al. |
| 6,784,359 B2 | 8/2004 | Clark et al. |
| 6,799,742 B2 | 10/2004 | Nakamura et al. |
| 6,882,072 B2 | 4/2005 | Wingett et al. |
| 6,897,730 B2 * | 5/2005 | Dupuis ............... H03F 1/0211 330/129 |
| 6,903,261 B2 | 6/2005 | Habraken et al. |
| 6,904,749 B2 | 6/2005 | Joshi et al. |
| 6,909,042 B2 | 6/2005 | Geyer et al. |
| 6,936,760 B2 | 8/2005 | Spirnak et al. |
| 6,983,914 B2 | 1/2006 | Stribling et al. |
| 7,006,039 B2 | 2/2006 | Miyamoto et al. |
| 7,053,294 B2 | 5/2006 | Tuttle et al. |
| 7,077,361 B1 | 7/2006 | Rabinowitz |
| 7,138,960 B2 | 11/2006 | Carroll et al. |
| 7,163,179 B1 | 1/2007 | Taylor |
| 7,211,722 B1 | 5/2007 | Murphy |
| 7,271,333 B2 | 9/2007 | Fabick et al. |
| 7,301,095 B2 | 11/2007 | Murphy et al. |
| 7,303,166 B2 | 12/2007 | Geery |
| 7,319,189 B2 | 1/2008 | Ruelle et al. |
| 7,354,033 B1 | 4/2008 | Murphey et al. |
| 7,392,011 B1 | 6/2008 | Jacomb-Hood |
| 7,464,895 B2 | 12/2008 | Palmer |
| 7,474,249 B1 | 1/2009 | Williams et al. |
| 7,486,431 B2 | 2/2009 | Rabinowitz |
| 7,564,149 B2 | 7/2009 | Sid et al. |
| 7,568,479 B2 | 8/2009 | Rabinowitz |
| 7,612,284 B2 | 11/2009 | Rogers et al. |
| 7,736,007 B2 | 6/2010 | Rabinowitz |
| 7,866,836 B2 | 1/2011 | Rabinowitz |
| 7,878,667 B2 | 2/2011 | Rabinowitz |
| 7,895,795 B1 | 3/2011 | Murphey et al. |
| 7,960,641 B2 | 6/2011 | Rabinowitz |
| 8,071,873 B2 | 12/2011 | Rabinowitz |
| 8,146,867 B2 | 4/2012 | Jordan et al. |
| 8,215,298 B2 | 7/2012 | Klotz |
| 8,308,111 B2 | 11/2012 | Lu et al. |
| 8,432,224 B1 * | 4/2013 | Woo ...................... H03F 3/195 330/279 |
| 8,439,511 B2 | 5/2013 | Stern et al. |
| 8,616,502 B1 | 12/2013 | Stribling et al. |
| 8,636,253 B1 | 1/2014 | Spence et al. |
| 8,683,755 B1 | 4/2014 | Spence et al. |
| 8,872,018 B1 | 10/2014 | Breen et al. |
| 9,004,410 B1 | 4/2015 | Steele et al. |
| 9,079,673 B1 | 7/2015 | Steele et al. |
| 9,120,583 B1 | 9/2015 | Spence et al. |
| 9,156,568 B1 | 10/2015 | Spence et al. |
| 9,248,922 B1 | 2/2016 | Baghdasarian et al. |
| 9,276,148 B2 | 3/2016 | Jaffe et al. |
| 9,346,566 B2 | 5/2016 | Spence et al. |
| 9,444,394 B1 | 9/2016 | Thomas et al. |
| 9,709,349 B2 | 7/2017 | Raman et al. |
| 10,144,533 B2 | 12/2018 | Atwater et al. |
| 10,340,698 B2 | 7/2019 | Pellegrino et al. |
| 10,454,565 B2 | 10/2019 | Pellegrino et al. |
| 2002/0007845 A1 | 1/2002 | Collette et al. |
| 2002/0029796 A1 | 3/2002 | Mikami et al. |
| 2002/0029797 A1 | 3/2002 | Mikami et al. |
| 2002/0032992 A1 | 3/2002 | Roth et al. |
| 2002/0134423 A1 | 9/2002 | Eller et al. |
| 2003/0098057 A1 | 5/2003 | Mizuno et al. |
| 2003/0098058 A1 | 5/2003 | Takada et al. |
| 2003/0192586 A1 | 10/2003 | Takada et al. |
| 2003/0196298 A1 | 10/2003 | Hinkley et al. |
| 2004/0011395 A1 | 1/2004 | Nicoletti et al. |
| 2004/0140930 A1 | 7/2004 | Harles |
| 2004/0187912 A1 | 9/2004 | Takamoto et al. |
| 2004/0231718 A1 | 11/2004 | Umeno et al. |
| 2005/0046977 A1 | 3/2005 | Shifman |
| 2005/0178921 A1 | 8/2005 | Stribling et al. |
| 2005/0241691 A1 | 11/2005 | Wakefield |
| 2005/0257823 A1 | 11/2005 | Zwanenburg |
| 2006/0038083 A1 | 2/2006 | Criswell |
| 2006/0109053 A1 | 5/2006 | Kim et al. |
| 2006/0157103 A1 | 7/2006 | Sheats et al. |
| 2006/0186274 A1 | 8/2006 | Wang et al. |
| 2006/0234694 A1 | 10/2006 | Kawasaki et al. |
| 2007/0029446 A1 | 2/2007 | Mosher et al. |
| 2007/0087704 A1 | 4/2007 | Gilberton |
| 2008/0000232 A1 | 1/2008 | Rogers et al. |
| 2008/0088409 A1 | 4/2008 | Okada |
| 2008/0149162 A1 | 6/2008 | Martinelli et al. |
| 2008/0173349 A1 | 7/2008 | Liu et al. |
| 2008/0185039 A1 | 8/2008 | Chan |
| 2008/0251113 A1 | 10/2008 | Horne et al. |
| 2008/0283109 A1 | 11/2008 | Mankins et al. |
| 2009/0126792 A1 | 5/2009 | Gruhlke et al. |
| 2009/0151769 A1 | 6/2009 | Corbin |
| 2009/0199893 A1 | 8/2009 | Bita et al. |
| 2009/0223554 A1 | 9/2009 | Sharps |
| 2009/0250094 A1 | 10/2009 | Robison et al. |
| 2009/0301544 A1 | 12/2009 | Minelli |
| 2010/0170560 A1 | 7/2010 | Sapienza et al. |
| 2010/0180946 A1 | 7/2010 | Gruhlke et al. |
| 2010/0224231 A1 | 9/2010 | Hoke |
| 2010/0263709 A1 | 10/2010 | Norman et al. |
| 2010/0269885 A1 | 10/2010 | Benitez et al. |
| 2010/0276547 A1 | 11/2010 | Rubenchik et al. |
| 2010/0289342 A1 | 11/2010 | Maness |
| 2010/0300507 A1 | 12/2010 | Heng et al. |
| 2010/0319774 A1 | 12/2010 | Schwartz |
| 2011/0041894 A1 | 2/2011 | Liao |
| 2011/0049992 A1 | 3/2011 | Sant'Anselmo et al. |
| 2011/0061718 A1 | 3/2011 | Fork et al. |
| 2011/0080135 A1 | 4/2011 | Bland |
| 2011/0100425 A1 | 5/2011 | Osamura et al. |
| 2011/0120524 A1 | 5/2011 | Wares et al. |
| 2011/0122016 A1 | 5/2011 | Lomes et al. |
| 2011/0203574 A1 | 8/2011 | Harding |
| 2011/0210209 A1 | 9/2011 | Taylor et al. |
| 2011/0232718 A1 | 9/2011 | Nawab |
| 2011/0300664 A1 | 12/2011 | Chung et al. |
| 2011/0315192 A1 | 12/2011 | Swatek et al. |
| 2012/0019942 A1 | 1/2012 | Morgan et al. |
| 2012/0024362 A1 | 2/2012 | Gossman |
| 2012/0031393 A1 | 2/2012 | Linderman et al. |
| 2012/0125415 A1 | 5/2012 | Tischler |
| 2012/0138749 A1 | 6/2012 | Ellinghaus |
| 2012/0138997 A1 | 6/2012 | Tasaki et al. |
| 2012/0160299 A1 | 6/2012 | Reid et al. |
| 2012/0243252 A1 | 9/2012 | Kim |
| 2013/0009851 A1 | 1/2013 | Danesh |
| 2013/0032673 A1 | 2/2013 | Kobayashi |
| 2013/0093287 A1 | 4/2013 | Biso et al. |
| 2013/0099599 A1 | 4/2013 | Jaffe et al. |
| 2013/0133730 A1 | 5/2013 | Pan et al. |
| 2013/0220399 A1 | 8/2013 | Gruhlke et al. |
| 2013/0233974 A1 | 9/2013 | Maiboroda et al. |
| 2013/0319504 A1 | 12/2013 | Yang et al. |
| 2013/0319505 A1 | 12/2013 | Yang et al. |
| 2013/0332093 A1 | 12/2013 | Adest et al. |
| 2014/0041705 A1 | 2/2014 | Kang et al. |
| 2014/0083479 A1 | 3/2014 | Takayama et al. |
| 2014/0102686 A1 | 4/2014 | Yu et al. |
| 2014/0131023 A1 | 5/2014 | Raman et al. |
| 2014/0148197 A1 | 5/2014 | Shields |

(56) References Cited

U.S. PATENT DOCUMENTS

| | | | |
|---|---|---|---|
| 2014/0150865 A1 | 6/2014 | Kwon et al. |
| 2014/0158197 A1 | 6/2014 | Rubenstein et al. |
| 2014/0159636 A1 | 6/2014 | Yang et al. |
| 2014/0261621 A1 | 9/2014 | Gruhlke et al. |
| 2014/0261622 A1 | 9/2014 | Floyd et al. |
| 2014/0263844 A1 | 9/2014 | Cook, Jr. et al. |
| 2014/0263847 A1 | 9/2014 | Eskenazi et al. |
| 2014/0326833 A1 | 11/2014 | Spence et al. |
| 2014/0356613 A1 | 12/2014 | Weisenberger et al. |
| 2015/0022909 A1 | 1/2015 | O'Neill |
| 2015/0053253 A1 | 2/2015 | O'Neill |
| 2015/0130293 A1 | 5/2015 | Hajimiri et al. |
| 2015/0144740 A1 | 5/2015 | Turse et al. |
| 2015/0155413 A1 | 6/2015 | Pokharna et al. |
| 2015/0217876 A1 | 8/2015 | Halsband |
| 2016/0056321 A1 | 2/2016 | Atwater et al. |
| 2016/0065006 A1 | 3/2016 | Woods |
| 2016/0122041 A1 | 5/2016 | Abrams et al. |
| 2016/0164451 A1 | 6/2016 | McEnaney et al. |
| 2016/0376037 A1 | 12/2016 | Pellegrino et al. |
| 2016/0380486 A1 | 12/2016 | Hajimiri et al. |
| 2016/0380580 A1 | 12/2016 | Atwater et al. |
| 2017/0021947 A1 | 1/2017 | Pellegrino et al. |
| 2017/0025992 A1 | 1/2017 | Atwater et al. |
| 2017/0047886 A1 | 2/2017 | Atwater et al. |
| 2017/0047889 A1 | 2/2017 | Atwater et al. |
| 2017/0047987 A1 | 2/2017 | Pellegrino et al. |
| 2017/0063296 A1 | 3/2017 | Cruijssen et al. |
| 2018/0315877 A1 | 11/2018 | Kelzenberg et al. |

FOREIGN PATENT DOCUMENTS

| | | |
|---|---|---|
| CN | 104158471 A | 11/2014 |
| EP | 0541052 A1 | 5/1993 |
| EP | 0977273 A1 | 2/2000 |
| EP | 0996170 A2 | 4/2000 |
| EP | 1501132 A2 | 1/2005 |
| EP | 976655 B1 | 9/2005 |
| EP | 1852919 A2 | 11/2007 |
| EP | 1852919 A3 | 2/2009 |
| EP | 2318045 A1 | 5/2011 |
| EP | 3149777 A1 | 4/2017 |
| FR | 2956774 A1 | 8/2011 |
| GB | 2247564 A | 3/1992 |
| JP | S6298781 A | 5/1987 |
| JP | S63254772 A | 10/1988 |
| JP | H0369258 U | 7/1991 |
| JP | H05107328 A | 4/1993 |
| JP | H06253477 A | 9/1994 |
| JP | H082500 A | 9/1996 |
| JP | 2000114571 A | 4/2000 |
| JP | 2001088799 A | 4/2001 |
| JP | 2001309581 A | 11/2001 |
| JP | 2002362500 A | 12/2002 |
| JP | 2003164077 A | 6/2003 |
| JP | 2003164078 A | 6/2003 |
| JP | 2003191899 A | 7/2003 |
| JP | 2004090817 A | 3/2004 |
| JP | 2004196051 A | 7/2004 |
| JP | 2004253471 A | 9/2004 |
| JP | 2004296658 A | 10/2004 |
| JP | 2009184603 A | 8/2009 |
| JP | 2010259301 A | 11/2010 |
| JP | 6640116 B2 | 1/2020 |
| WO | 2004049538 A2 | 6/2004 |
| WO | 2008073905 A2 | 6/2008 |
| WO | 2009124098 A2 | 10/2009 |
| WO | 2010033632 A2 | 3/2010 |
| WO | 2011006506 A1 | 1/2011 |
| WO | 2011062785 A2 | 5/2011 |
| WO | 2011067772 A1 | 6/2011 |
| WO | 2011109275 A1 | 9/2011 |
| WO | 2011062785 A3 | 11/2011 |
| WO | 2015175839 | 11/2015 |
| WO | 2015175839 A1 | 11/2015 |
| WO | 2015179213 A2 | 11/2015 |
| WO | 2015179214 A2 | 11/2015 |
| WO | 2015187221 A2 | 12/2015 |
| WO | 2015187739 | 12/2015 |
| WO | 2017015508 | 1/2017 |
| WO | 2017015605 | 1/2017 |
| WO | 2017027615 | 2/2017 |
| WO | 2017027617 | 2/2017 |
| WO | 2017027629 | 2/2017 |
| WO | 2017027633 | 2/2017 |

OTHER PUBLICATIONS

International Preliminary Report on Patentability for International Application PCT/US2015/030909, dated Nov. 15, 2016, dated Nov. 24, 2016, 11 Pgs.

International Preliminary Report on Patentability for International Application PCT/US2015/033841, dated Dec. 6, 2016, dated Dec. 15, 2016, 8 Pgs.

International Search Report and Written Opinion for International Application No. PCT/US2016/043424, completed Nov. 15, 2016, dated Nov. 15, 2016, 14 Pgs.

International Search Report and Written Opinion for International Application No. PCT/US2016/043677, completed Oct. 21, 2016, dated Oct. 21, 2016, 8 Pgs.

International Search Report and Written Opinion for International Application No. PCT/US2016/046389, completed Nov. 22, 2016, dated Nov. 22, 2016, 11 Pgs.

International Search Report and Written Opinion for International Application No. PCT/US2016/046394, completed Nov. 17, 2016, dated Nov. 17, 2016, 12 Pgs.

International Search Report and Written Opinion for International Application No. PCT/US2016/046415, completed Nov. 17, 2016, dated Nov. 17, 2016, 10 Pgs.

International Search Report and Written Opinion for International Application No. PCT/US2016/046421, completed Nov. 17, 2016, dated Nov. 17, 2016, 10 Pgs.

Aieta et al., "Multiwavelength achromatic metasurfaces by dispersive phase compensation", Science, vol. 347, Issue 6228, DOI:10.1126/science.aaa2494, Mar. 20, 2015, pp. 1342-1345.

Aoki et al., "A Fully Integrated Quad-Band GSM/GPRS CMOS Power Amplifier", IEEE Journal of Solid-State Circuits, vol. 43, No. 12, Dec. 12, 2008, pp. 2747-2758.

Bakr et al., "Impact of phase and amplitude errors on array performance", UC Berkeley Technical Report No. UCB/EECS-2009-1. Retrieved from http://www.eecs.berkeley.com/Pubs/TechRpts/2009/EECS-2009-1.html, Jan. 1, 2009, 12 pgs.

Bohn et al., "Fully Integrated Frequency and Phase Generation for a 6-18GHz Tunable Multi-Band Phased-Array Receiver in CMOS", Radio Frequency Integrated Circuits Symposium (RFIC), Apr. 17-Jun. 17, 2008. IEEE, pp. 439-442.

Brongersma et al., "Light management for photovoltaics using high-index nanostructures", Nature Materials, vol. 13, No. 25, May 2014, pp. 451-460.

Callahan et al., "Light trapping in ultrathin silicon photonic crystal superlattices with randomly-textured dielectric incouplers", Optics Express, vol. 21, Issue 25, DOI: 10.1364/OE.21.030315, Dec. 16, 2013, pp. 30315-30326.

Campbell et al., "A Pixel Readout Chip for 10-30 Mrad in Standard 0.25μm CMOS", IEEE Transactions on Nuclear Science, vol. 46, No. 3, Jun. 1999, pp. 156-160.

Cao et al., "A 4.5 MGy TID-Tolerant CMOS Bandgap Reference Circuit Using a Dynamic Base Leakage Compensation Technique", IEEE Transactions on Nuclear Science, vol. 60, No. 4, Aug. 2013, pp. 2819-2824.

Geisz et al., "Infrared Reflective and Transparent Inverted Metamorphic Triple Junction Solar Cells", AIP Conference Proceedings, vol. 1277, Issue 11, Oct. 14, 2010, pp. 11-15.

Kaltenbrunner et al., "Flexible high power-per-weight perovskite solar cells with chromium oxide—metal contacts for improved stability in air", Nature Materials, vol. 14, doi:10.1038/nmat4388, Aug. 24, 2015, pp. 1032-1039.

(56) References Cited

OTHER PUBLICATIONS

Lacoe, R. C., "Improving Integrated Circuit Performance Through the Application of Hardness-by-Design Methodology", IEEE Transactions on Nuclear Science, vol. 55, No. 4, Aug. 2008, pp. 1903-1925.

Lamoureux et al., "Dynamic kirigami structures for integrated solar tracking", Nature Communications, DOI:10.1038/ncomms9092, vol. 6, No. 8092, Sep. 8, 2015, pp. 1-6.

Lohmeyer et al., "Correlation of GEO communication satellite anomalies and space weather phenomena: Improved satellite performance and risk mitigation", paper presented at 30th AIAA International Communications Satellite Systems Conference (ICSSC), Ottawa, Canada, Jul. 13, 2012, pp. 1-20.

Messenger et al., "Status of Implementation of Displacement Damage Dose Method for Space Solar Cell Degradation Analyses", 2008 Dd EOL Calc via SPENVIS manuscript SRM2, Jan. 2008, 8 pgs.

Narita et al., "Development of high accuracy phase control method for space solar power system", Proc. IEEE International Microwave Workshop Series on Innovative Wireless Power Transmission: Technologies, Systems, and Applications, May 12-13, 2011, p. 227-230.

Nishioka et al., "Evaluation of temperature characteristics of high-efficiency InGaP/InGaAs/Ge triple-junction solar cells under concentration", Solar Energy Materials and Solar Cells, vol. 85, Issue 3, Jan. 31, 2005, pp. 429-436.

O'Brien et al., "The AE9/AP9 Radiation Specification Development", Aerospace Corporation, Sep. 15, 2009, Report No. TOR-2009(3905)-8, 29 pgs.

Petrovic et al., "Design Methodology for Fault Tolerant ASICs", IEEE 15th International Symposium, Design and Diagnostics of Electronic Circuits & Systems (DDECS), Apr. 18-20, 2012, pp. 8-12.

Rephaeli et al., "Ultrabroadband Photonic Structures to Achieve High-Performance Daytime Radiative Cooling", Nano Letters, vol. 13, Mar. 5, 2013, pp. 1457-1461.

Sato et al., "Modeling of degradation behavior of InGaP/GaAs/Ge triple-junction space solar cell exposed to charged particles", Journal of Applied Physics, vol. 105, 2009, pp. 044504-1-044504-6.

Silverman et al., "Outdoor Performance of a Thin-Film Gallium-Arsenide Photovoltaic Module", presented at the 39th IEEE Photovoltaic Specialist Conference, Jun. 16-21, 2013, Tampa, Florida, USA, 6 pgs.

Snoeys et al., "Integrated Circuits for Particle Physics Experiments", IEEE Journal Solid-State Circuits, vol. 35, Issue 12, Dec. 2000, pp. 2018-2030.

Wang et al., "A Broadband Self-Healing Phase Synthesis Scheme", Radio Frequency Integrated Circuits Symposium (RFIC), IEEE, Jun. 5-7, 2011, 4 pgs.

ATI Industrial, Multi-Axis Force / Torque Sensor, ATI Industrial Automation, Jul. 23, 2014, pp. 1-44.

DuPont Kapton, Mar. 2012, 26 pgs.

Extended European Search Report for European Application No. 15803447.0, Search completed Oct. 17, 2017, dated Oct. 25, 2017, 10 Pgs.

Smooth on, Mold Max® XLS® II, Jan. 15, 2016, 2 pgs.

"AZ Technology | Materials, Paint and Coatings: AZ-93 White Thermal Control, Electrically Conductive Paint / Coating (AZ's Z-93P)", Available http://www.aztechnology.com/materials-coatings-az-93.html, Accessed: Dec. 19, 2016, 2 pgs.

"Corona Resistant Kapton CR Takes Electrical Insulation Design and Reliability to New Levels", Kapton, DuPont Films, H-54506-1, 4 pages.

"DuPont Kapton 100CRC: Technical Data Sheet", kapton.dupont. com, Jul. 2014, K-28402, 2 pages.

"DuPont Kapton 120FWN616B", kapton.dupont.com, K-28459, Sep. 2014, 1 page.

"DuPont Kapton 150FCRC019", kapton.dupont.com, K-28402, Jun. 2014, 2 pages.

"DuPont Kapton 150FWN019: Magnet Wire Insulation", www. kapton.dupont.com, H-78319-01, Mar. 2005, 2 pages.

"DuPont Kapton 150FWR019: Insulation Substrate", www.dupont. com/kapton, H-78312, Nov. 2001, 2 pages.

"DuPont Kapton 150PRN411", kapton.com, K-28731, Dec. 2014, 2 pages.

"DuPont Kapton 200FWR919: Insulation Substrate", www.dupont. com/kapton, H-78313, Nov. 2001, 2 pages.

"DuPont Kapton 200RS100", kapton.com, K-15354-2, Sep. 2014, 1 page.

"DuPont Kapton B: Technical Bulletin", kapton.dupont.com, K-25099-1, Jul. 2013, 1 page.

"DuPont Kapton FCR: Advanced Magnet Wire Insulation", Jun. 2005, H-99888, 2 pages.

"DuPont Kapton FN: Polyimide Film", kapton.com, K-15347-2, Jun. 2015, 2 pages.

"DuPont Kapton FPC: Polyimide Film", kapton.dupont.com, K-15361, Mar. 2006, 5 pages.

"DuPont Kapton GS Polyimide Film: Technical Data Sheet", kapton. dupont.com, K-26875-1, Jul. 2014, 2 pages.

"DuPont Kapton HN: Polyimide Film", kapton.dupont.com, K-15345-1, Apr. 2011, 5 pages.

"DuPont Kapton HPP-ST: Polyimide Film", kapton.dupont.com, K-15357, Mar. 2006, 5 pages.

"DuPont Kapton MT: Technical Data Sheet", kapton.dupont.com, H-38497-3, Apr. 2014, 1 page.

"DuPont Kapton PST: Polyimide Film", kapton.dupont.com, K-10790, Nov. 2005, 4 pages.

"DuPont Kapton PV9100 Series: Polyimide Films", kapton.dupont. com, K-26028-1_A4, Oct. 2012, 2 pages.

"DuPont Kapton: Polyimide Film", kapton.dupont.com, Mar. 2012, H-38479-9, 7 pgs.

"ESA. Composite material structures.", printed Jun. 29, 2017 from http://www.esa.int/Our_Activities/Space_Engineering_Technology/Structures/Composite_Materials_structures, Oct. 20, 2014, 2 pgs.

"Orbital ATK", Coilable Boom Systems. Technical report, Oct. 18, 1989, 2 pgs.

"Space solar power limitless clean energy from space", National Space Society, printed Jun. 29, 2017 from http://www.nss.org/settlement/ssp/, May 2017, 11 pgs.

Aguirre-Martinez et al., "Development of a Continuous Manufacturing Method for a Deployable Satellite Mast in CFRP", 15th Reinforced Plastics Congress 1986, Sep. 1986, pp. 107-110.

Aieta et al., "Aberration-Free Ultrathin Flat Lenses and Axicons at Telecom Wavelengths Based on Plasmonic Metasurfaces", Nano Lett., Web publication date Aug. 2, 2012, vol. 12, No. 9, pp. 4932-4936.

Amacher et al., "Thin ply composites: Experimental characterization and modeling of size-effects", Composites Science and Technology, Jul. 11, 2014, vol. 101, pp. 121-132.

Andryieuski et al., "Rough metal and dielectric layers make an even better hyperbolic metamaterial absorber", Optics Express, Jun. 11, 2014, vol. 22, No. 12, pp. 14975-14980.

Arai, "Pitch-based carbon fiber with low modulus and high heat conduction", Nippon Steel Technical Report No. 84, Jul. 11, 2001, pp. 12-17.

Arbabi et al., "Multiwavelength polarization-insensitive lenses based on dielectric metasurfaces with meta-molecules", Optics, Jan. 22, 2016, vol. 3, Issue 6, pp. 628-633.

Arbabi et al., "Subwavelength-thick lenses with high numerical apertures and large efficiency based on high-contrast transmitarrays", Nature Communications, May 5, 2015, vol. 6, pp. 7069, doi:10.1038/ncomms8069.

Arbabi et al., "Dielectric Metasurfaces for Complete Control of Phase and Polarization with Subwavelength Spatial Resolution and High Transmission", Nature Nanotechnology, Aug. 31, 2015, 27 pgs., doi:10.1038/nnano.2015.186.

Arya, "Packaging and Deployment of Large Planar Spacecraft Structures", Thesis of Manan Arya, May 2, 2016, 131 pgs.

Arya et al., "Ultralight Structures for Space Solar Power Satellites", American Institute of Aeronautics and Astronautics, 2016, pp. 1-18.

Banik et al., "Performance Validation of the Triangular Rollable and Collapsible Mast", Proceedings of the 24th Annual AIAA/USU Conference on Small Satellites, Logan, UT, Aug. 9, 2010, 8 pgs.

(56) References Cited

OTHER PUBLICATIONS

Bapanapalli et al., "The Effect of Tool-Part Interactions on the Geometry of Laminated Composites", Washington State University, Jul. 10, 2016, 8 pages.
Biddy et al., "LightSail-1 solar sail design and qualification", Proceedings of the 41st Aerospace Mechanisms Symposium, May 16, 2012, pp. 451-463.
Cahill et al., "Nanoscale thermal transport. II. 2003-2012", Applied Physics Review, Jan. 14, 2014, vol. 1, No. 1, pp. 011305-1-011305-45.
Calladine et al., "The theory of thin shell structures 1888-1988", Proceedings of the Institution of Mechanical Engineers, Part A: Journal of Power and Energy, vol. 202, No. 3, Jan. 7, 1988, pp. 141-149.
Castle Jr., "Heat conduction in carbon materials", 1st Biennial Conference of the American Carbon Society, Nov. 2, 1953, pp. 13-19.
Chen et al., "Planar Heterojunction Perovskite Solar Cells via Vapor-Assisted Solution Process", Journal of the American Chemical Society 136, Dec. 20, 2013, pp. 622-625.
Cheng et al., "Optical metasurfaces for beam scanning in space", Optics Letters, May 1, 2014, vol. 39, No. 9, pp. 2719-2722.
David, "Extraterrestrial mining could reap riches and spur exploration", http://www.space.com/16273-extraterrestrial-mining-asteroids-moon.html, Jun. 25, 2012, 7 pgs.
Du Toit et al., "Advances in the design of Jaumann absorbers", in Antennas and Propagation Society International Symposium, 1990. AP-S. Merging Technologies for the 90's. Digest., May 7, 1990, vol. 3, pp. 1212-1215.
Elfiky et al., "Study the effects of proton irradiation on GaAs/Ge solar cells", 35th IEEE Photovoltaic Specialist Conference, Jul. 2010, pp. 002528-002532.
Emerson, "Electromagnetic wave absorbers and anechoic chambers through the years", IEEE Trans. Antennas Propag., vol. 21, No. 4, Jul. 1973, pp. 484-490.
Eperon et al., "Morphological Control for High Performance, Solution-Processed Planar Heterojunction Perovskite Solar Cells", Advanced Functional Materials 24, first published Sep. 9, 2013, pp. 151-157.
Ersoy et al., "An experimental method to study the frictional processes during composites manufacturing", Composites Part A: Applied Science and Manufacturing, Feb. 19, 2005, vol. 36, No. 11, pp. 1536-1544.
Estvanko et al., "Numerical analysis of a tape spring hinge folded about two axes", Earth and Space 2012© Engineering, Science, Construction, and Operations in Challenging Environments, ASCE, Jul. 11, 2012, pp. 714-721.
Fallahi et al., "Thin wideband radar absorbers", Transactions on Antennas and Propagation, Nov. 30, 2010, vol. 58, No. 12, pp. 4051-4058.
Fante et al., "Reflection properties of the Salisbury screen", IEEE Transactions on Antennas and Propagation, Oct. 1988, vol. 36, No. 10, pp. 1443-1454.
Fernandez, "Advanced Deployable Shell-Based Composite Booms for Small Satellite Structural Applications Including Solar Sails", International Symposium on Solar Sailing, Jan. 17-20, 2017, Kyoto, Japan, 19 pgs.
Fernlund, "Experimental and numerical study of the effect of cure cycle, tool surface, geometry, and lay-up on the dimensional fidelity of autoclave-processed composite parts", Composites—Part A: Applied Science and Manufacturing, 33(3):341-351, 2002.
Herbeck et al., "Development and test of deployable ultra-lightweight CFRP-booms for a Solar Sail", European Space Agency, (Special Publication) ESA SP, 49(468):107-112, 2001.
Hillebrandt et al., "The Boom Design of the De-Orbit Sail Satellite", European Conference on Spacecraft Structures, Materials and Mechanical Testing, European Conference on Spacecraft Structures, Materials & Environmental Testing, Apr. 1-4, 2014, Braunschweig, Germany, 8 pgs.

Huang et al., "Gate-tunable conducting oxide metasurfaces", Nano Letters, vol. 16, No. 9., web publication date Aug. 26, 2016, pp. 5319-5325.
Irwin et al., "Low-Mass Deployable Spacecraft Booms", AIAA Space 2010 Conference & Exposition, pp. 1-11, Aug. 30, 2010.
Jang et al., "Tunable large resonant absorption in a midinfrared graphene Salisbury screen", Physical Review. B, Oct. 8, 2014, vol. 90, No. 16, pp. 165409-1-165409-5.
Kelly, "On Kirchhoff's law and its generalized application to absorption and emission by cavities", Journal of Research of the National Bureau of Standards—B. Mathematics and Mathematical Physics, Jul.-Sep. 1965, vol. 69B, No. 3, pp. 165-171.
Kildishev et al., "Planar Photonics with Metasurfaces", Science, Mar. 15, 2013, vol. 339, No. 6125, pp. 1232009-1-1232009-6.
Knott et al., "Performance Degradation of Jaumann Absorbers Due to Curvature", IEEE Transactions on Antennas and Propagation, Jan. 1980, vol. AP28, No. 1, pp. 137-139.
Kryder et al., "Heat Assisted Magnetic Recording", Proceeding of the IEEE, current version published Dec. 2, 2008, vol. 96, No. 11, pp. 1810-1835.
Leclerc et al., "Characterization of Ultra-Thin Composite Triangular Rollable and Collapsible Booms", 4th AIAA Spacecraft Structures Conference, AIAA SciTech Forum, Jan. 2017, 15 pgs.
Lee et al., "Non-Destructive Wafer Recycling for Low-Cost Thin-Film Flexible Optoelectronics", Advanced Functional Materials, Apr. 2, 2014, vol. 24, pp. 4284-4291.
Liang et al., "Additive Enhanced Crystallization of Solution-Processed Perovskite for Highly Efficient Planar-Heterojunction Solar Cells", Advanced Materials, Mar. 14, 2014, vol. 26, pp. 3748-3754.
Liu et al., "Microstructure, thermal shock resistance and thermal emissivity of plasma sprayed LaMAl11 O19(M=Mg, Fe) coatings for metallic thermal protection systems", Applied Surface Science, vol. 271, Feb. 6, 2013, pp. 52-59.
Luukkonen et al., "A thin electromagnetic absorber for wide incidence angles and both polarizations", IEEE Transactions on Antennas and Propagation, Jul. 28, 2009, pp. 3119-3125.
Mankins, "A technical overview of the "SunTower" solar power satellite concept", Acta Astronautica, 50(6):369-377, Mar. 1, 2002.
Messenger et al., "Quantifying low energy proton damage in multijunction solar cell", in the proceedings of the 19th Space photovoltaic research and technology conference, 2005, NASA/CP-2007-214494, pp. 8-17.
Miyazawa et al., "Evaluation of radiation tolerance of perovskite solar cell for use in space", Photovoltaic Specialist Conference (PVSC), 2015 IEEE 42nd, New Orleans, LA, USA, Dec. 17, 2015, pp. 1-4, published Jun. 1, 2015.
Mizuno et al., "A black body absorber from vertically aligned single-walled carbon nanotubes", Proc. Natl. Acad. Sci., Apr. 14, 2009, vol. 106, No. 15, pp. 6044-6047.
Narimanov et al., "Reduced reflection from roughened hyperbolic metamaterial", Optics Express, Jun. 17, 2013, vol. 21, No. 12, pp. 14956-14961.
Ni et al., "Metasurface holograms for visible light", Nature Communications, Nov. 15, 2013, vol. 4, pp. 1-6.
NTPT, "NTPT Thin prepreg 402", Data sheet, Version 1.6, May 11, 2017, 5 pgs.
O'Hara, "Mechanical properties of silicone rubber in a closed volume", Technical Report, Army Armament Research and Development Center, Dec. 1983, 21 pgs.
Pellegrino, "AAReST telescope architecture", obtained from http://www.pellegrino.caltech.edu/aarest2/, printed Jul. 5, 2017, 4 pgs.
Penjuri et al., "Simulation and Testing of Deployable CFRP Booms for Large Space Structures", PhD thesis, Aug. 2011, 118 pgs.
Pors et al., "Analog Computing Using Reflective Plasmonic Metasurfaces", Nano Lett., Dec. 18, 2014, vol. 15, pp. 791-797.
Radford et al., "Measurement of Manufacturing Distortion in Flat Composite Laminates", International Conference on Composite Materials, Jul. 1999, 9 pgs.
Radford et al., "Separating Sources of Manufacturing Distortion in Laminated Composites", Journal of Reinforced Plastics and Composites, first published May 1, 2000, vol. 19, No. Aug. 2000, pp. 621-641.

(56) References Cited

OTHER PUBLICATIONS

Rakic et al., "Algorithm for the determination of intrinsic optical constants of metal films: application to aluminum", Applied Optics, Aug. 1, 1995, vol. 34, No. 22, pp. 4755-4767.

Rakic et al., "Optical Properties of Metallic Films for Vertical-Cavity Optoelectronic Devices", Applied Optics, Aug. 1, 1998, vol. 37, No. 22, pp. 5271-5283.

Raman et al., "Passive radiative cooling below ambient air temperature under direct sunlight", Nature, Nov. 27, 2014, vol. 515, pp. 540-544.

Reha et al., "A Dual-Band Rectangular CPW Folded Slot Antenna for GNSS Applications", International Journal of Advanced Research in Electrical, Electronics and Instrumentation Engineering, Aug. 2014, pp. 11055-11061.

Rephaeli et al., "Absorber and emitter for solar thermo-photovoltaic systems to achieve efficiency exceeding the Shockley-Queisser limit", Optics. Express, Aug. 11, 2009, vol. 17, No. 17, pp. 15145-15159.

Santer et al., "Composite Tube Flexures at Nanosatellite Scale", 4th AIAA Space-craft Structures Conference, Jan. 9-13, 2017, 12 pgs.

Sasaki, "How Japan plans to build an orbital solar farm", printed from https://energy.gov/articles/space-based-solar-power, published Apr. 24, 2014, 5 pages.

Seffen et al., "Deployment dynamics of tape springs", Proceedings of the Royal Society of London A: Mathematical, Physical and Engineering Sciences, Mar. 9, 1999, vol. 455, pp. 1003-1048.

Shaltout et al., "Time-varying metasurfaces and Lorentz non-reciprocity", Optical Materials Express, Nov. 1, 2015, vol. 5, No. 11, pp. 2459-2467.

Shin-Etsu, "Meeting the increasingly diverse and sophisticated needs of industry with the unique properties of silicone rubbers", Characteristic properties of Silicone Rubber Compounds, 2013, 16 pgs.

Sickinger et al., "Lightweight deployable booms: Design, manufacture, verification, and smart materials application", 55th International Astronautical Congress, Vancouver, Canada, Oct. 4-8, 2004, pp. 1-11.

Sihn et al., "Experimental studies of thin-ply laminated composites", Composites Science and Technology, May 1, 2007, vol. 67, pp. 996-1008.

Silva et al., "Performing Mathematical Operations with Metamaterials", Science, Jan. 10, 2014, vol. 343, No. 6167, pp. 160-163.

Stabile et al., "Coiling dynamic analysis of thin-walled composite deployable boom", Composite Structures, Mar. 29, 2014, vol. 113, pp. 429-436.

Steeves, "Multilayer Active Shell Mirrors", Thesis of John Steeves, May 5, 2015, 165 pgs.

Streyer et al., "Strong absorption and selective emission from engineered metals with dielectric coatings", Optics Express, Apr. 8, 2013, vol. 21, No. 7, pp. 9113-9122.

Stuart et al., "Absorption enhancement in silicon-on-insulator waveguides using metal island films,", Appl. Phys. Lett., Oct. 14, 1996, vol. 69, No. 16, pp. 2327-2329.

Stuart et al., "Island size effects in nanoparticle-enhanced photodetectors", Appl. Phys. Lett., Dec. 28, 1998, vol. 73, No. 26, pp. 3815-3817.

Svanberg et al., "An experimental investigation on mechanisms for manufacturing induced shape distortions in homogeneous and balanced laminates", Composites—Part A: Applied Science and Manufacturing, Jun. 1, 2001, vol. 32, pp. 827-838.

Torayca, "T800H Technical Data Sheet", Technical report No. CFA-007, 2 pgs.

Walker et al., "An investigation of tape spring fold curvature", Proceedings of the 6th International Conference on Dynamics and Control of Systems and Structures in Space, Citeseer, 2004, 10 pgs.

Walters et al., "Spenvis implementation of end-of-life solar cell calculations using the displacement damage dose methodology", in the Proceedings of the 19th Space Photovoltaic Research and Technology Conference, Feb. 1, 2007, 9 pgs.

Weinberg et al., "Radiation and temperature effects in gallium arsenide, indium phosphide, and silicon solar cells", National Aeronautics and Space Administration Technical Memorandum 89870, May 4-8, 1987, 14 pgs., published Feb. 1, 1987.

Wells et al., "Metamaterials-based Salisbury screens with reduced angular sensitivity", Appl. Phys. Lett., Oct. 21, 2014, vol. 105, pp. 161105-1-161105-4.

White et al., "Cure Cycle Optimization for the Reduction of Processing-Induced Residual Stresses in Composite Materials", Journal of Composite Materials, Dec. 1, 1993, vol. 27, No. 14, pp. 1352-1378.

Whorton et al., "Nanosail-D: the first flight demonstration of solar sails for nanosatellites", 22nd AIAA/USU Conference on Small Satellites, Aug. 11, 2008, pp. 1-6.

Wood, "Space-based solar power", printed Jul. 5, 2017 from https://energy.gov/articles/space-based-solar-power, Mar. 6, 2014, 7 pgs.

Wu et al., "Retarding the crystallization of Pbl2 for highly reproducible planar-structured perovskite solar cells via sequential deposition", Energy & Environmental Science 7, Jun. 24, 2014, pp. 2934-2938.

Yamaguchi, "Radiation-resistant solar cells for space use", Solar Energy Materials & Solar Cells, 2001, vol. 68, pp. 31-53.

Yamaguchi et al., "Correlations for damage in diffused-junction InP solar cells induced by electron and proton irradiation", Journal of Applied Physics, May 1, 1997, vol. 81, No. 9, 6013-6018.

Yamaguchi et al., "Mechanism for the anomalous degradation of Si solar cells induced by high fluence 1 MeV electron irradiation", Applied Physics Letters, May 27, 1996, vol. 68, No. 22, pp. 3141-3143.

Yu et al., "A Broadband, Background-Free Quarter-Wave Plate Based on Plasmonic Metasurfaces", Nano Letters, Nov. 3, 2012, vol. 12, No. 12, pp. 6328-6333.

Yu et al., "Flat optics with designer metasurfaces", Nature Materials, published online Feb. 2014, vol. 13, pp. 139-150.

Zhang et al., "Infrared Refractive Index and Extinction Coefficient of.Polyimide Films", International Journal of Thermophysics, May 1, 1998, vol. 19, No. 3, pp. 905-916.

Zheng et al., "Metasurface holograms reaching 80% efficiency", Nature.Nanotechnology, published online Feb. 23, 2015, pp. 1-6.

Zhu et al., "Radiative cooling of solar cells", Optica, Jul. 22, 2014, vol. 1, pp. 32-38.

Zhu et al., "Radiative cooling of solar absorbers using a visibly transparent photonic crystal thermal blackbody", PNAS, Oct. 6, 2015, vol. 112, pp. 12282-12287.

International Search Report and Written Opinion for International Application No. PCT/US2015/030895, completed Nov 27, 2015, dated Nov. 30, 2015, 14 Pgs.

International Search Report and Written Opinion for International Application No. PCT/US2015/030909, completed Nov. 27, 2015, dated Nov. 27, 2015, 13 Pgs.

International Search Report and Written Opinion for International Application PCT/US2015/030900, Completed Aug. 11, 2015, dated Aug. 13, 2015, 11 pgs.

International Search Report and Written Opinion for International Application PCT/US2015/033841, Completed Sep. 10, 2015, dated Sep. 11, 2015, 11 pgs.

Arya et al., "Wrapping Thick Membranes with Slipping Folds", American Institute of Aeronautics and Astronautics, date unknown, pp. 1-17.

Delapierre et al., "Spin-Stabilized Membrane Antenna Structures", American Institute of Aeronautics and Astronautics, date unknown, pp. 1-15.

NASA TV, "Solar Power, Origami-Style", printed Aug. 14, 2014 from http://www.nasa.gov/jpl/news/origami-style-power-20140814, 4 pgs.

Extended European Search Report for European Application No. 15795587.3, Search completed Feb. 5, 2018, dated Feb. 12, 2018, 7 Pgs.

International Preliminary Report on Patentability for International Application PCT/US2016/043424, Report completed Dec. 2, 2017, dated Dec. 15, 2017, 153 Pgs.

(56) References Cited

OTHER PUBLICATIONS

International Preliminary Report on Patentability for International Application PCT/US2016/043677, Report dated Jan. 23, 2018, dated Feb. 1, 2018, 6 Pgs.
International Preliminary Report on Patentability for International Application PCT/US2016/046389, Report dated Feb. 13, 2018, dated Feb. 22, 2018, 9 Pgs.
International Preliminary Report on Patentability for International Application PCT/US2016/046394, Report dated Feb. 13, 2018, dated Feb. 22, 2018, 10 Pgs.
International Preliminary Report on Patentability for International Application PCT/US2016/046415, Report dated Feb. 13, 2018, dated Feb. 22, 2018, 8 Pgs.
International Preliminary Report on Patentability for International Application PCT/US2016/046421, Report dated Feb. 13, 2018, dated Feb. 22, 2018, 8 Pgs.
Vaccaro et al., "In-flight experiment for combined planar antennas and solar cells (SOLANT)", IET Microwaves Antennas & Propaga, vol. 3, No. 8, Dec. 1, 2009 (Dec. 1, 2009), pp. 1279-1287.
International Preliminary Report on Patentability for International Application PCT/US2016/043424, Report dated May 15, 2018, dated May 24, 2018, 12 Pgs.
Borriello et al., "Ab initio investigation of hybrid organic-inorganic perovskites based on tin halides", Physical Review B, Jun. 23, 2008, vol. 77, 235214, 9 pgs.
Conings et al., "Intrinsic thermal instability of methylammonium lead trihalide perovskite", Advanced Energy Materials, Jun. 2, 2015, DOI: 10.1002/aenm.201500477, 8 pgs.
Preston et al., "From plasmon spectra of metallic to vibron spectra of dielectric nanoparticles", Accounts of Chemical Research, Jan. 9, 2012, vol. 45, No. 9, pp. 1501-1510.
Scholl et al., "Quantum plasmon resonances of individual metallic nanoparticles", Nature, Mar. 22, 2012, vol. 483, doi:10.1038/nature10904, pp. 421-428.
Tsai et al., "High-efficiency two-dimensional Ruddlesden-Popper perovskite.solar cells", Nature, Aug. 18, 2016, vol. 536, doi:10.1038/nature18306, 15 pgs.
Weinberg et al., "Radiation and temperature effects in gallium arsenide, indium phosphide, and silicon solar cells", NASA Technical Memorandum 89870, Washington, D.C., May 4-8, 1987, 14 pgs.
Zhang et al., "Intrinsic instability of the hybrid halide perovskite semiconductor CH3NH3PbI3", Chinese Physics Letters, Jun. 3, 2015, vol. 35, No. 3, 036104, 11 pgs.
Jaffe et al., "Development of a Sandwich Module Prototype for Space Solar Power", 2012 IEEE Aerospace Conference, Mar. 3-10, 2012, Big Sky, MT, USA, pp. 1-9, DOI: 10.1109/AERO.2012.6187077.
Jaffe et al., "Energy Conversion and Transmission Modules for Space Solar Power", Proceedings of the IEEE, Jun. 2013, vol. 101, No. 6, pp. 1424-1437, DOI: 10.1109/JPROC.2013.2252591.
Mankins, "SPS-ALPHA: The First Practical Solar Power Satellite via Arbitrarily Large Phased Array (A 2011-2012 NASA NIAC Phase 1 Project)", Artemis Innovation Management Solutions LLC, Sep. 15, 2012, NIAC Phase 1 Final Report, 113 pgs.
Rubenchik et al., "Solar Power Beaming: From Space to Earth", U.S. Department of Energy Office of Scientific and Technical Information, Apr. 14, 2009, Technical Report LLNL-TR-412782, 16 pgs. DOI: 10.2172/952766.
Sasaki et al., "A new concept of solar power satellite: Tethered-SPS", Acta Astronautica, 2006, vol. 60, pp. 153-165, doi:10.1016/j.actaastro.2006.07.010.
Extended European Search Report for European Application No. 16828571.6, Search completed Mar. 18, 2019, dated Mar. 22, 2019, 17 Pgs.
Extended European Search Report for European Application No. 16835856.2, Search completed Feb. 22, 2019 dated Mar. 1, 2019, 8 Pgs.

\* cited by examiner

SYSTEMS AND METHODS FOR CONTROLLING SUPPLY VOLTAGES OF STACKED POWER AMPLIFIERS

CROSS-REFERENCE TO RELATED APPLICATIONS

This application claims priority to U.S. provisional patent application Ser. No. 62/203,159 entitled "Space-based Solar Power System—2," filed on Aug. 10, 2015; U.S. provisional patent application Ser. No. 62/220,017 entitled "Space-based Solar Power System—3," filed on Sep. 17, 2015; U.S. provisional patent application Ser. No. 62/239,706 entitled "Space-based Solar Power System—4," filed on Oct. 9, 2015; U.S. provisional patent application Ser. No. 62/264,500 entitled "Space-based Solar Power System—5," filed on Dec. 8, 2015; U.S. provisional patent application Ser. No. 62/268,632 entitled "Space-based Solar Power System—6," filed on Dec. 17, 2015; U.S. provisional patent application Ser. No. 62/270,425 entitled "Space-based Solar Power System—7," filed on Dec. 21, 2015; U.S. provisional patent application Ser. No. 62/295,947 entitled "Space-based Solar Power System—8," filed on Feb. 16, 2016; U.S. provisional patent application Ser. No. 62/320,819 entitled "Space-based Solar Power System—9," filed on Apr. 11, 2016; U.S. provisional patent application Ser. No. 62/330,341 entitled "Space-based Solar Power System—10," filed on May 2, 2016; U.S. provisional patent application Ser. No. 62/340,644 entitled "Space-based Solar Power System—11," filed on May 24, 2016; U.S. provisional patent application Ser. No. 62/352,392 entitled "Space-based Solar Power System—12," filed on Jun. 20, 2016; U.S. provisional patent application Ser. No. 62/366,720 entitled "Space-based Solar Power System—13," filed on Jul. 26, 2016; all of which are incorporated by reference herein in their entirety.

FIELD OF THE INVENTION

The present invention is related to mechanisms for controlling the operation of power amplifiers that can be used within systems including (but not limited to) space-based solar power stations, and more particularly to the operation of multiple stacked amplifiers from a single power supply under varying operating conditions.

BACKGROUND

Space-based solar power (SBSP) describes the collection of solar power in space by a solar-power satellite or a satellite power system (SPS) and then the conversion and transmission of the power to a remote receiver for conversion back to electrical power. In an SBSP system, solar energy is collected as electrical energy on board, powering some manner of wireless power transmission to a receiver located remotely from the SBSP. The wireless power transmission application might include a microwave transmitter or laser emitter, which would direct its beam toward a collector, such as a power receiving rectenna at the remote location, such as, on the Earth's surface.

SBSP differs from ground-based solar collection methods in that the means used to collect energy resides on an orbiting satellite instead of on the Earth's surface. Basing such a system in space results in a higher collection rate for the solar energy due to the lack of a diffusing atmosphere. In a conventional ground-based system a large percentage (55-60%) of the solar energy is lost on its way through the atmosphere by the effects of reflection and absorption.

Space-based solar power systems convert solar energy to a far-field emission such as microwaves outside the atmosphere, avoiding these losses. In addition, SBSP systems have a longer collection period and the ability to collect solar energy continuously without the downtime (and cosine losses, for fixed flat-plate collectors) that result from the Earth's rotation away from the sun.

A general limitation for conventional SBSP systems is the size of SPS required to generate sufficient electrical power from solar energy. For example, for a 500 MW system a 5 $km^2$ platform may be required. Such a platform would be formed of large satellites on the order to tens to hundreds of tonnes/satellite. The launch costs associated with placing such large structures into orbit reduces the economic viability of such SBSP systems.

SUMMARY OF THE INVENTION

Systems and methods in accordance with various embodiments of the invention provide a circuit that includes several power amplifiers having supply connections connected in series and used to convert electric current received via a supply connection into RF power that can be transmitted via an RF signal, one or more current sensors to monitor the operating characteristics, including a supply current, of each power amplifier, and control circuitry configured to control each of the plurality of power amplifiers based on the operating characteristics of the plurality of power amplifiers.

In a further embodiment, the control circuitry adjusts a supply current drawn by one or more of the power amplifiers based on data derived from the one or more current sensors.

In another embodiment, the circuit includes one or more voltage sensors that monitor the operating characteristics of the plurality of power amplifiers.

In a still further embodiment, the control circuitry increases a supply current drawn by a power amplifier.

In still another embodiment, the control circuitry adjusts a supply current drawn by one or more of the power amplifiers by modifying bias voltages of transistors within the power amplifiers.

A yet further embodiment, the bias voltage is selected from the group consisting of a gate bias, a base bias, and a cascode bias.

In a yet another embodiment, the control circuitry further includes a bypass device that provides a path to bypass current around a specific power amplifier.

In a further embodiment again, the one or more sensors includes an analog peak voltage detector and a DC current detector.

In another embodiment again, an output of the one or more sensors is converted by an analog-to-digital (ADC) converter.

In a further additional embodiment, the control circuitry further comprises a microcontroller for monitoring the supply current.

In another additional embodiment, the microcontroller controls the magnitude of bias by performing a proportional-summation-difference (PSD) control process.

In a still yet further embodiment, the microcontroller controls the magnitude of bypass current by performing a PSD control process.

In still yet another embodiment, the microcontroller controls the supply current using a proportional-integral-derivative (PID) process.

A yet further additional embodiment includes a control method for controlling supply voltages provided to a plurality of power amplifiers, the control method including:

monitoring operating characteristics, including a supply current, to each of a plurality of power amplifiers using one or more current sensors, wherein the plurality of power amplifiers have supply connections connected in series and are used to convert electric current received via a supply connection into RF power that can be transmitted via an RF signal, controlling a supply current provided to each of the plurality of power amplifiers based on the operating characteristics of the plurality of power amplifiers.

Yet another additional embodiment, the control method includes adjusting a supply current drawn by one or more of the power amplifiers based on data derived from the one or more current sensors.

In another embodiment, the control method includes monitoring the operating characteristics of the plurality of power amplifiers using one or more voltage sensors.

In still another embodiment, the control method includes increasing a supply current drawn by a power amplifier.

In still another embodiment again, the control method includes adjusting a supply current drawn by one or more of the power amplifiers by modifying bias voltages of transistors within the power amplifiers.

In yet still another embodiment, the bias voltage is selected from the group consisting of a gate bias, a base bias, and a cascode bias.

In a further embodiment again, the control method includes controlling the supply current comprises using a bypass device that provides a path to bypass current around a specific power amplifier.

In still another embodiment, the one or more current sensors comprise an analog peak voltage detector and a DC current detector.

In still another embodiment again, an output of the one or more sensors is converted by an analog-to-digital (ADC) converter.

Another embodiment of the invention includes a power generation tile, including: at least one photovoltaic cell, and at least one power transmitter collocated with the at least one photovoltaic cell and in signal communication therewith such that an electrical current generated by the collection of solar radiation by the at least one photovoltaic cell powers the at least one power transmitter, where each of the at least one power transmitters includes: several power amplifiers having supply connections connected in series and used to convert electric current received via a supply connection into RF power that can be transmitted via an RF signal, and control circuitry configured to control a supply voltage provided to each of the plurality of power amplifiers based on the operating characteristics of the plurality of power amplifiers.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein.

DETAILED DESCRIPTION

Figure 1:
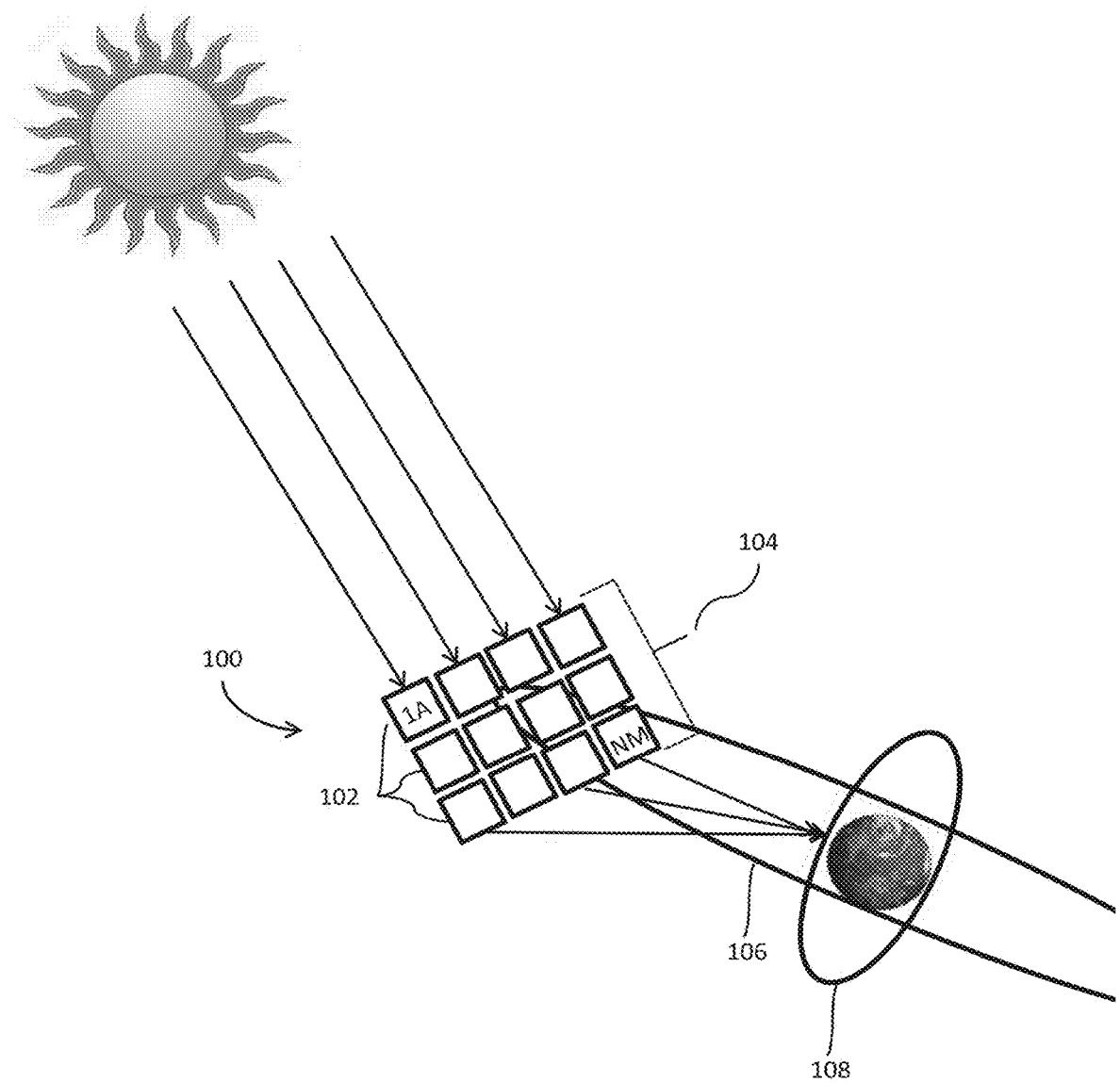
FIG. 1 conceptually illustrates a large-scale space-based solar power station with a plurality of power satellite modules in geosynchronous orbit about the Earth, according to one embodiment.

Turning now to the drawings, efficient power amplifier configurations and methods of controlling supply voltages of power amplifiers having supply connections connected in series in accordance with various embodiments of the invention are illustrated. Modern integrated circuit technology processes, particularly CMOS technologies, severely limit the maximum supply voltage allowable across a single transistor. Furthermore, the ideal operating condition of solar cells for generating electric power, in particular the ideal operating voltage and current, frequently misalign with the conditions that may be required by the various electronic components such as microwave power amplifiers. A way to align operating voltages and currents may use conventional DC-to-DC power converters such as the various known topologies of Boost, Buck, Buck-Boost, Cuk, Flyback, charge-pumped based or linear converters or other suitable converters. These converters, however, can add additional electric losses as well as frequently require heavy components such as magnetic core based inductors that add weight and cost to the system. Because most of the electric power supplied by the solar cells may be utilized in the power amplifier output stages that generate microwave power, means of aligning the voltage and current requirements of the power amplifier with the requirements, as described in the present invention, can potentially significantly reduce system weight and cost.

Thus, in order for a power amplifier to generate appreciable amounts of output power, the current consumption of the main amplifying devices should be increased while keeping the maximum output voltage limited. Apart from having to accommodate low RF impedances, these circuits tend to require power supply rails capable of supplying large supply currents at low output voltages, which tends to increase resistive losses in supply voltage converters as well as supply conductors. In some applications where multiple power amplifying stages are required to operate simultaneously, such as, for example, phased arrays with a multitude of individual amplifiers driving a multitude of individual antennas, it can therefore be advantageous to connect the supply connections of the power amplifying stages in series, thus increasing the overall supply voltage required of the series connection while conducting the same or reasonably similar supply current of a single amplifier through multiple amplifiers. In this way, the supply voltage for the amplifiers that needs to be generated can be made more similar or even the same as the supply voltage required by other circuitry, as well as lowering the overall current consumption and hence lowering electric losses incurred in voltage regulators and supply connections.

As an example, in a modern CMOS process technology node, a CMOS FET device can tolerate 1V drain-source (output) voltage to reliably operate over a certain period of time without significant degradation. Using well-known circuit topologies and modes of operation such as Class E/F, a single transistor power amplifier could operate at a supply voltage of approximately 400 mV to limit the peak voltage to the aforementioned 1V, while the remainder of the circuit, (e.g. digital control circuitry), can operate from a 1V supply since its peak output voltage is limited to the supply voltage value due to the different circuit topologies utilized by the circuit. Thus, in order to use a single 1V supply, a voltage converter can first convert the 1V available from the supply to the 0.4V required by the circuit. If, however, two of the 0.4V power amplifiers are connected in series through their supply connections, they together require a supply voltage of 0.8V with the same demand on current as a single amplifier assuming they are operating in a reasonably similar manner. This 0.8V supply voltage can typically be provided from the assumed 1V supply incurring less loss for the reasons given above than a supply of 0.4V with twice the current demand if these two power amplifier supplies were to be operated in parallel. Power amplifier configurations involving two or more power amplifiers with supply connections connected in series in accordance with many embodiments of the invention include control circuitry, including a microcontroller, that limit losses incurred when the power amplifiers operate under varying operational characteristics. In a number of embodiments, the control circuitry includes sensors that detect the operating characteristics of each of the power amplifiers and one or more current bypass circuits that can be utilized to divert current around a power amplifier to modify its operating characteristics.

As noted above, many power amplifiers are utilized in large-scale space-based solar power (SBSP) stations and/or individual satellite modules that generate and transmit power. Accordingly, a number of embodiments of the invention utilize power amplifier configurations including at least two power amplifiers with supply connections connected in series and control circuitry configured to control the operation of each of the power amplifiers in power transmitters of power generation tiles within a SBSP. In many embodiments, the SBSP systems include arrays of independent satellite modules each incorporating arrays of independent solar electric power generation tiles. In several embodiments, the power generation tiles are each formed incorporating independent photovoltaic cells, power transmitters, and control circuits. The satellite modules and power generation tiles may be formed from compactible structures according to some embodiments. Methods for deploying, stabilizing, operating and constructing such large-scale space-based solar power systems that include power amplifier configurations including at least two power amplifiers with supply connections connected in series and control circuitry configured to control the operation of each of the power amplifiers in accordance with a number of embodiments of the invention are also described. Similar systems and methods are described in: U.S. provisional patent application Ser. No. 61/993,016 entitled "Large-Scale Space-Based Array: Packaging, Deployment and Stabilization of Lightweight Structures," filed on May 14, 2014; U.S. provisional patent application Ser. No. 61/993,025 entitled "Large-Scale Space-Based Array: Multi-Scale Modular Space Power System," filed on May 14, 2014; U.S. provisional patent application Ser. No. 61/993,957 entitled "Large-Scale Space-Based Array: Modular Phased Array Power Transmission," filed May 15, 2014; U.S. provisional patent application Ser. No. 61/993,037 entitled "Large-Scale Space-Based Array: Space-Based Dynamic Power Distribution System," filed May 14, 2014; U.S. patent application Ser. No. 14/712,812 entitled "Large-Scale Space-Based Solar Power Station: Packaging, Deployment and Stabilization of Lightweight Structures," filed May 14, 2015; U.S. patent application Ser. No. 14/712,783 entitled "Large-Scale Space-Based Solar Power Station: Multi-Scale Modular Space Power," filed May 14, 2015; and U.S. patent application Ser. No. 14/712,856 entitled "Large-Scale Space-Based Solar Power Station: Power transmission Using Steerable Beams," filed May 14, 2015, the disclosures of all of which are incorporated by reference herein in their entirety.

Large-scale space-based solar power stations are discussed in detail below prior to a discussion of power amplifier configurations including at least two power amplifiers with supply connections connected in series and control circuitry configured to control the operation of each of the power amplifiers and the use of such configurations in the power generation tiles of satellite modules and SBSPs in accordance with various embodiments of the invention.

Large-Scale Space-Based Solar Power Stations

A large-scale space-based solar power station in accordance with many embodiments of the invention is a modular space-based construct that can be formed from a plurality of independent satellite modules placed into orbit within an orbital formation such that the position of each satellite module relative to each other is known. Each of the satellite modules can include a plurality of power generation tiles that capture solar radiation as electrical current and use the current to transmit the energy to one or more remote receivers using power transmitters. In many instances, the transmissions are generated using microwave power transmitters that are coordinated to act as a phased- and/or amplitude array capable of generating a steerable beam and/or focused beam that can be directed toward one or more remote receivers. In other embodiments, any of a variety of appropriate power transmission technologies can be utilized including (but not limited to) optical transmitters such as lasers.

Many embodiments relate to lightweight space structures used to construct the modular elements of the solar power station. Some lightweight space structures are used in the construction of the power generation tiles and/or satellite modules and may incorporate movable elements that allow the lightweight space structure to be compacted prior to deployment to reduce the area or dimensional length, height and/or width of the power generation tiles and/or satellite modules prior to deployment. The space structures may be made of any number, size and configuration of movable elements, and the elements may be configured to compact according to any suitable compacting mechanism or configuration, including one or two-dimensional compacting using, among others, z-folding, wrapping, rolling, fan-folding, double z-folding, Miura-ori, slip folding, wrapping, and combinations thereof. Some embodiments of movable elements are interrelated by hinges, such as, frictionless, latchable, ligament, and slippage hinges, among others. Some embodiments of structures are pre-stressed and/or provided with supportive frameworks to reduce out-of-plane macro- and micro-deformation of the lightweight structures. Structures and modules may include dynamic stabilizing movement (e.g., spinning) during deployment and/or operation. Deployment mechanisms to deploy the compactible lightweight structures into a deployed operational state may be incorporated into or associated with embodiments of the lightweight structures. Some deployment mechanisms may include (but are not limited to) expansive boom arms, centrifugal force mechanisms such as tip masses or module self-mass, among others.

Large-scale space-based solar power stations according to many embodiments utilize a distributed approach to capture solar radiation, and use the energy thus captured to operate power transmitters, which transmit power to one or more remote receivers (e.g., using laser or microwave emissions). The satellite modules of the solar power station can be physically independent structures, each comprising an independent array of power generation tiles. The satellite modules are each placed into a specified flying formation within an array of such satellite modules in a suitable orbit about the Earth. The position of each of the independent satellite modules in space within the orbital array formation is controllable via a combination of station-keeping thrusters and controlled forces from absorption, reflection, and emission of electromagnetic radiation, as well as guidance controls. Using such controllers each of the independent satellite modules may be positioned and maintained within the controlled orbital array formation relative to each of the other satellite modules so that each satellite module forms an independent modular element of the large-scale space-based solar power station. The solar radiation received by each of the power generation tiles of each of the independent satellite module is utilized to generate electricity, which powers one or more power transmitters on each of the power generation tiles. Collectively, the power transmitters on each of the power generation tiles can be configured as independent elements of a phased and/or amplitude-array.

The power generation tiles and/or satellite modules may also include separate electronics to process and exchange timing and control information with other power generation tiles and/or satellite modules within the large-scale space-based solar power station. In many implementations, the separate electronics form part of an integrated circuit that possesses the ability to independently determine a phase offset to apply to a reference signal based upon the position of an individual tile and/or transmitter element. In this way, coordination of a phased array of antennas can be achieved in a distributed manner.

In some embodiments of the distributive approach, different array elements of the phased array may be directed to transmit power with different transmission characteristics (e.g., phase) to one or more different remote power receiving collectors (e.g., ground based rectenna). Each satellite module of power generation tiles, or combinations of power generating tiles across one or more satellite modules, may thus be controlled to transmit energy to a different power receiving collector using the independent control circuitry and associated power transmitters.

A photovoltaic cell (PV) refers to an individual solar power collecting element on a power generation tile in a satellite module. The PV includes any electrical device that converts the energy of light directly into electricity by the photovoltaic effect including elements made from polysilicon and monocrystalline silicon, thin film solar cells that include amorphous silicon, CdTe and CIGS cells, multijunction cells, perovskite cells, organic/polymer cells, and various alternatives thereof.

A power transmitter or radiator refers to an individual radiative element on a power generation tile in a satellite module and its associated control circuitry. A power transmitter can include any device capable of converting power in the electrical current generated by the PV to a wireless signal, such as microwave radiation or light, including (but not limited to) a laser, a klystron, a traveling-wave tube, a gyrotron, or suitable transistor and/or diode. A power transmitter may also include suitable transmissive antennas, such as, dipole, patch, helical or spherical antennas, among others.

A phased array refers to an array of power transmitters in which the relative phases of the respective signals feeding the power transmitters are configured such that the effective radiation pattern of the power emission of the array is reinforced in a desired emission direction and suppressed in undesired directions. Phased arrays in accordance with embodiments may be dynamic or fixed, active or passive.

An orbital array formation refers to any size, number or configuration of independent satellite modules being flown in formation at a desired orbit in space such that the position of the satellite modules relative to each other is known such that power generation tiles on each of the satellite modules within the formation serves as an array element in the phased array of the solar power station.

A power generation tile refers to an individual solar power collecting and transmitting element in the phased array of the large-scale space-based solar power station. In many embodiments a power generation tile is a modular solar radiation collector, converter and transmitter that collects solar radiation through at least one photovoltaic cell disposed on the tile, and uses the electrical current to provide power to at least one power transmitter collocated on the same tile that transmits the converted power to one or more remote power receiving collectors. Many of the power generation tiles incorporated within a space-based solar power station include separate control electronics to independently control the operation of the at least one power transmitter located on the power generation tile based upon timing, position, and/or control information that may be received from other tiles and/or other modules within the large-scale space-based solar power station. In this way, the separate control electronics can coordinate (in a distributed manner) the transmission characteristics of each of the power generation tiles to form a phased array. Each power generation tile may also include other structures such as radiation collectors for focusing solar radiation on the photovoltaic, thermal radiators for regulating the temperature of the power generation tile, and radiation shielding, among other structures.

A satellite module refers to an array of power generation tiles collocated on a single integral space structure. The space structure of the satellite module may be a compactable structure such that the area occupied by the structure may be expanded or contracted depending on the configuration assumed. The satellite modules may include two or more power generation tiles. Each power generation tile may include at least one solar radiation collector and power transmitter. As discussed above, each of the power generation tiles may transmit power and may be independently controlled to form an array element of one or more phased arrays formed across the individual satellite module or several such satellite modules collectively. Alternatively, each of the power generation tiles collocated on a satellite module may be controlled centrally.

A lightweight space structure refers to integral structures of movably interrelated elements used in the construction of the power generation tiles and/or satellite modules that may be configurable between at least packaged and deployed positions wherein the area and or dimensions of the power generation tiles and/or satellite modules may be reduced or enlarged in at least one direction. The lightweight space structures may incorporate or be used in conjunction with deployment mechanisms providing a deploying force for urging the movable elements between deployed and compacted configurations.

A large-scale space-based solar power station or simply solar power station refers to a collection of satellite modules being flown in an orbital array formation designed to function as one or more phased arrays. In embodiments the one or more phased arrays may be operated to direct the collected solar radiation to one or more power receiving collectors.

Transmission characteristics of a power generation tile refer to any characteristics or parameters of the power transmitter of the power generation tile associated with transmitting the collected solar radiation to a power receiving collector via a far-field emission. The transmission characteristics may include, among others, the phase and operational timing of the power transmitter and the amount of power transmitted.

Structure of Large-Scale Space-Based Solar Power Station

A large-scale space-based solar power station including a plurality of satellite modules positioned in an orbital array formation in a geosynchronous orbit about the Earth in accordance with certain embodiments of the invention is illustrated in FIG. 1. The large-scale space-based solar power station 100 includes an array of independent satellite modules 102. The solar power station 100 is configured by placing a plurality of independent satellite modules 102 into a suitable orbital trajectory in an orbital array formation 104, according to one embodiment. The solar power station 100 may include a plurality of such satellite modules 1A through NM. In one embodiment, the satellite modules 1A through NM are arranged in a grid format as illustrated in FIG. 1. In other embodiments, the satellite modules are arranged in a non-grid format. For example, the satellite modules may be arranged in a circular pattern, zigzagged pattern or scattered pattern. Likewise, the orbit may be either geosynchronous 106, which is typically at an altitude of 35,786 km above the Earth, or low Earth 108, which is typically at an altitude of from 800 to 2000 km above the Earth, depending on the application of the solar power station. As can readily be appreciated, any orbit appropriate to the requirements of a specific application can be utilized by a space-based solar power station in accordance with various embodiments of the invention.

Figure 2:
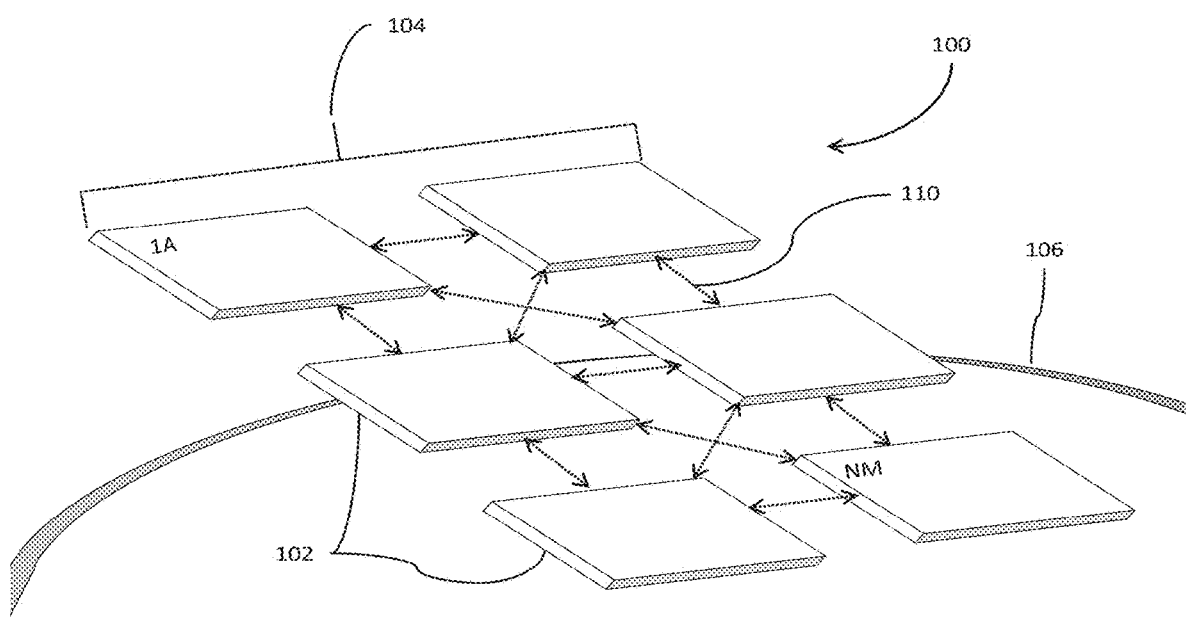
FIG. 2 conceptually illustrates a large-scale space-based solar power station with a plurality of power satellite modules flying in a rectangular orbital formation, according to one embodiment.

In some embodiments, the satellite modules in the solar power station are spatially separated from each other by a predetermined distance. By increasing the spatial separation, the maneuverability of the modules in relation to each other is simplified. As discussed further below, the separation and relative orientation of the satellite modules can impact the ability of the power generation tile on each of the satellite modules to operate as elements within a phased array. In one embodiment, each satellite module 1A through NM may include its own station keeping and/or maneuvering propulsion system, guidance control, and related circuitry. Specifically, as illustrated in FIG. 2, each of the satellite modules 102 of the solar power station 100 may include positioning sensors to determine the relative position 110 of the particular satellite module 1A through NM in relation to the other satellite modules 1A to NM, and guidance control circuitry and propulsion system to maintain the satellite module in a desired position within the arbitrary formation 104 of satellite modules during operation of the solar power station. Positioning sensors in accordance with many embodiments can include the use of external positioning data from global positions system (GPS) satellites or international ground station (IGS) network, as well as onboard devices such as inertial measurement units (e.g., gyroscopes and accelerometers), and combinations thereof. In several embodiments, the positioning sensors can utilize beacons that transmit information from which relative position can be determined that are located on the satellite modules and/or additional support satellites. The guidance control and propulsion system may likewise include any suitable combination of circuitry and propulsion system capable of maintaining each of the satellite modules in formation in the solar power station array 104. In many embodiments the propulsion system may utilize, among others, one or more of chemical rockets, such as biopropellant, solid-fuel, resistojet rockets, etc., electromagnetic thrusters, ion thrusters, electrothermal thrusters, solar sails, etc. Likewise, each of the satellite modules may also include attitudinal or orientational controls, such as, for example, reaction wheels or control moment gyroscopes, among others.

Figure 3:
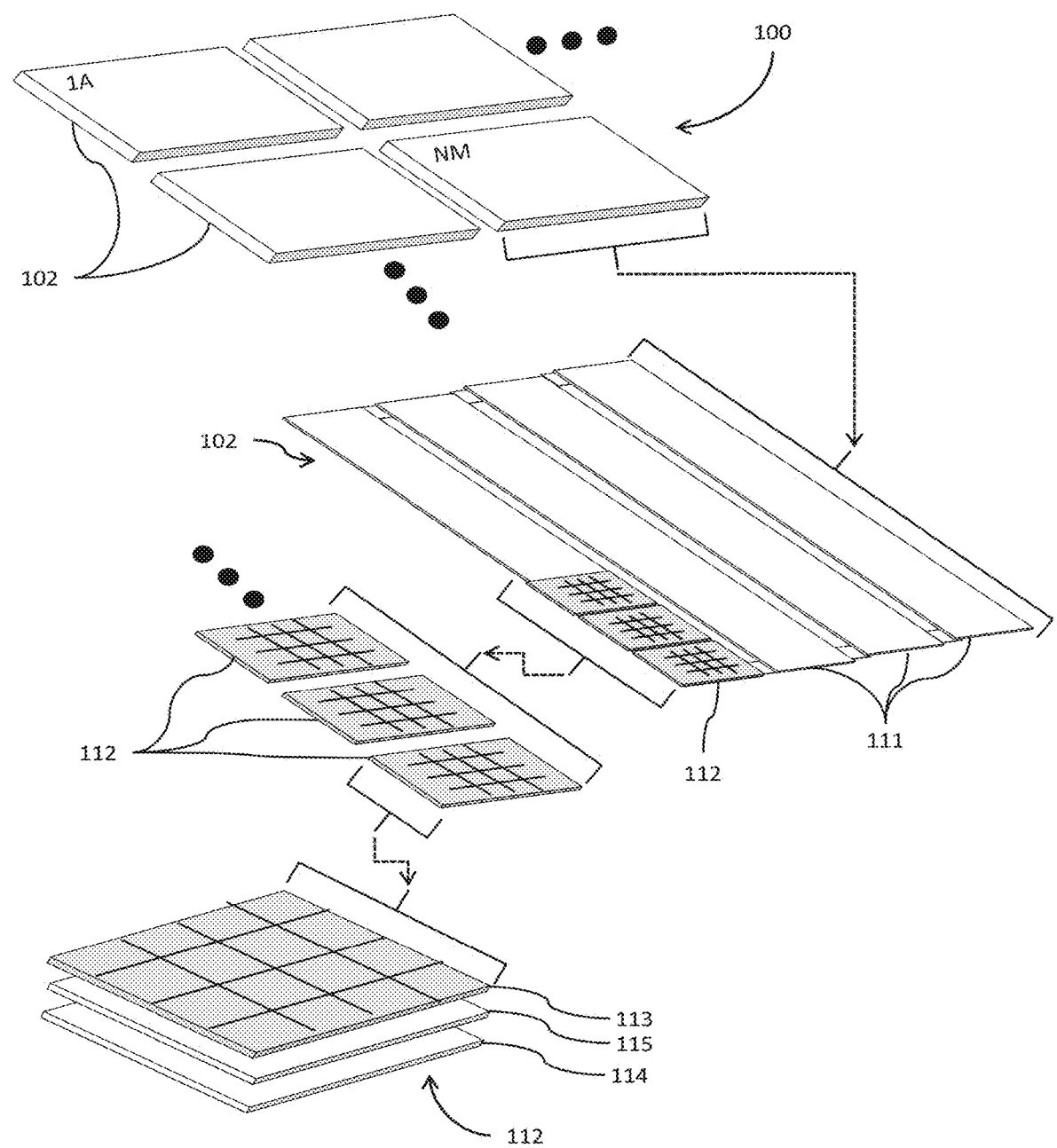
FIG. 3 conceptually illustrates a large-scale space-based solar power station, a satellite module, and a cross-sectional view of a modular power generation tile, according to one embodiment.

In many embodiments, as illustrated in FIG. 3, each satellite module 1A through NM of the solar power station 100 comprises a space structure comprised of one or more interconnected structural elements 111 having one or more power generation tiles 112 collocated thereon. Specifically, each of the satellite modules 1A through NM is associated with an array of power generation tiles 112 where each of the power generation tiles of the array each independently collect solar radiation and convert it to electric current. Power transmitters convert the electrical current to a wireless power transmission that can be received by a remote power receiving station. As discussed above, one or more power transmitters on each of a set of power generation tiles can be configured as an element in one or more phased arrays formed by collections of power generation tiles and satellite modules of the overall solar power station. In one embodiment, the power generation tiles in the satellite module are spatially separated from each other by a predetermined distance. In other embodiments, the construction of the satellite modules is such that the power generation tiles are separated by distances that can vary and the distributed coordination of the power generation tiles to form a phased array involves the control circuitry of individual power transmitters determining phase offsets based upon the relative positions of satellite modules and/or individual power generation tiles.

Figure 4A:
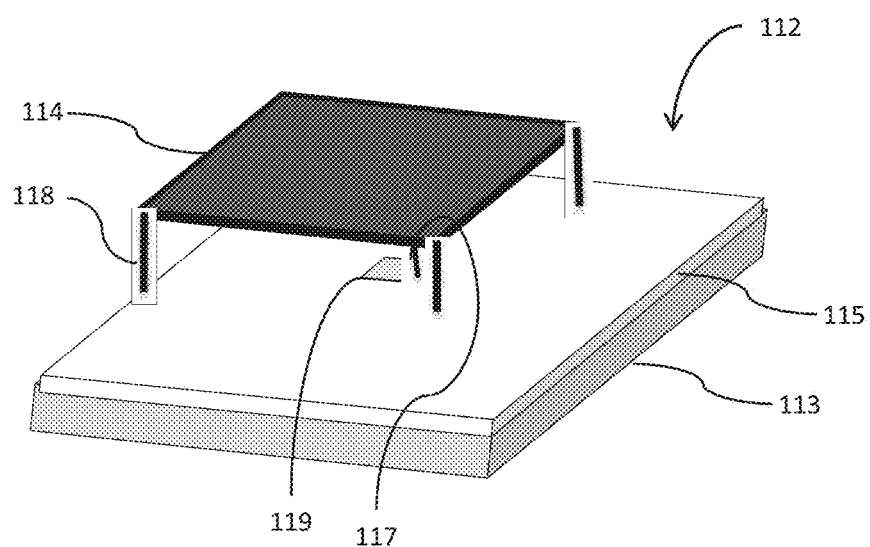
FIG. 4a conceptually illustrates a cross-sectional view of a modular power generation tile, according to one embodiment.
Figure 4A:
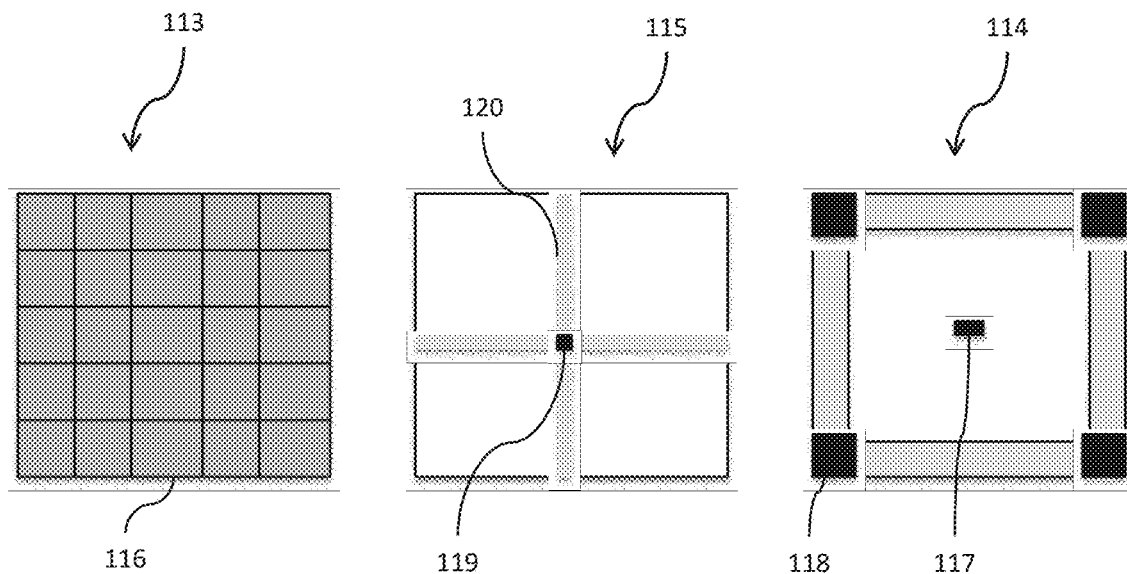

Power generation tiles 112 according to many embodiments include a multicomponent structure including a photovoltaic cell 113, a power transmitter 114, and accompanying control electronics 115 electrically interconnected as required to suit the needs of the power transmission application. As illustrated in FIG. 4a, in some embodiments photovoltaic cells 113, may comprise a plurality of individual photovoltaic elements 116 of a desired solar collection area that may be interconnected together to produce a desired electrical current output across the power generation tile. Some power transmitters 114 include one or more transmission antennas, which may be of any suitable design, including, among others, dipole, helical and patch. In the illustrated embodiment, a conventional patch antenna 114 incorporating a conductive feed 117 to conductively interconnect the RF power from the control electronics 115 to the antenna 114. As can readily be appreciated the specific antenna design utilized is largely dependent upon the requirements of a specific application. Some power transmitters 114 are physically separated from one or both of the photovoltaic cell 113 and/or the control electronics 115 such as by fixed or deployable spacer structures 118 disposed therebetween. Some control electronics 115 may include one or more integrated circuits 119 that may control some aspect of the power conversion (e.g., to a power emission such as collimated light or an radio frequency (RF) emission such as microwave radiation), movement and/or orientation of the satellite module, inter- and intra-satellite module communications, and transmission characteristics of the power generation tile and/or satellite module. Further conductive interconnections 120 may connect the control electronics 115 to the source power of the photovoltaic cell 113. Each of the power generation tiles may also include thermal radiators to control the operating temperature of each of the power generation tiles.

Figure 4B:
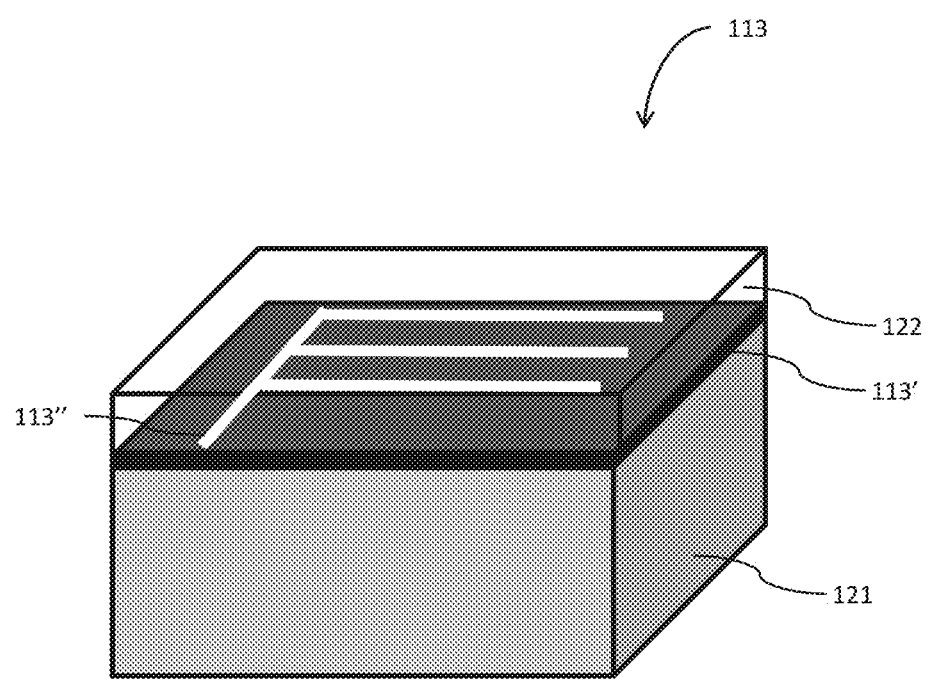
FIG. 4b conceptually illustrates a cross-sectional view of a photovoltaic cell, according to one embodiment.

In some embodiments, the PV 113 is a multi-layer cell, as illustrated in FIG. 4b, incorporating at least an absorber material 113' having one or more junctions 113" disposed between a back contact 121 on a back side of the absorber material and a top radiation shield 122 disposed on the surface of the absorber material in the direction of the incident solar radiation. The PV may include any electrical device that converts the energy of light directly into electricity by the photovoltaic effect including elements made from polysilicon and monocrystalline silicon, thin film solar cells that include amorphous silicon, CdTe and CIGS cells, multijunction cells, perovskite cells, organic/polymer cells, and various alternatives thereof. In some embodiments the photovoltaic material used within the PV cell is made from a thin film of GaInP/GaAs that is matched to the solar spectrum. Radiation shielding may include a solar radiation transparent material such as $SiO_2$ or glass, among others. The back contact may be made of any suitable conductive material such as a conductive material like aluminum, among others. The thickness of the back contact and top radiation shield may be of any thickness suitable to provide radiation shielding to the PV. Additional structures may be provided around the PV to increase the efficiency of the absorption and operation of the device including, for example, one or more concentrators that gather and focus incoming solar radiation on the PV, such as a Cassegrain, parabolic, nonparabolic, hyperbolic geometries or combinations thereof. The PV may also incorporate a temperature management device, such as a radiative heat sink. In some embodiments the temperature management device is integrated with the control electronics and may be configured to control the operating temperature of the PV within a range of from ~150 to 300 K. Particularly effective configurations for power generation tiles are discussed in a subsequent section of this application.

In a number of embodiments, the power transmitters that are components of power generation tiles are implemented using a combination of control circuitry and one or more antennas. The control circuitry can provide the power generation tile with the computational capacity to determine the location of the power generation tile antenna(s) relative to other antennas within the satellite module and/or the solar power station. As can readily be appreciated, the relative phase of each element within a phased array is determined based upon the location of the element and a desired beam direction and/or focal point location. The control circuitry on each power generation tile can determine an appropriate phased offset to apply to a reference signal using a determined location of the power generation tile antenna(s) and beam-steering information. In certain embodiments, the control circuitry receives position information for the satellite module and utilizes the position information to determine the location of the power generation tile antenna(s) and determine a phase offset to apply to a reference signal. In other embodiments, a central processor within a satellite module can determine the locations of antennas on power generation tiles and/or phase offsets to apply and provides the location and/or phase offset information to individual power generation tiles.

In many embodiments, the positional information of each tile is received from partially redundant systems, such as, but not limited to, gyroscopes, accelerometers, electronic ranging radar, electronic positioning systems, phase and/or timing information from beacons, as well as employing a priori knowledge from system steering and flight control commands. In several embodiments, electronic systems are located on the ground, and/or in space on satellites deployed for this purpose (and, possibly, other purposes, e.g. in the case of using GPS satellites).

In a number of embodiments, position information may be relayed in a hierarchical fashion between modules, panels and/or tiles within the space-based solar power station, such that a central processing unit relays positional information such as location and orientation of the entire space-based solar power station with respect to a ground station and/or other suitable known locations to modules within the system. The relayed information can be expressed as an absolute and/or differential location(s), and/or orientation(s) as appropriate to the requirements of specific applications. In a similar fashion, the location and/or orientation of each module with respect to the center of the space-based solar power station or other suitable reference point can be determined at each module using processes similar to those outlined above. Furthermore, going down a hierarchical level, the position and orientation information of individual panels and tiles can be determined in a similar fashion. The entirety or any useful part of this information can be used at the tile-level, the panel-level, the module-level, the system-level and/or any combination thereof to control the phase and/or amplitude of each tile radiator to form a beam or focal spot on the ground. The aggregate computational power of the computational resources of each tile, panel and/or module can be utilized since each tile (and/or panel or module) can utilize its local computational power available from a DSP, microcontroller or other suitable computational resource to control its operation such that the system in aggregate generates the desired or close-to desired beam and/or focused transmission.

Figure 4C:
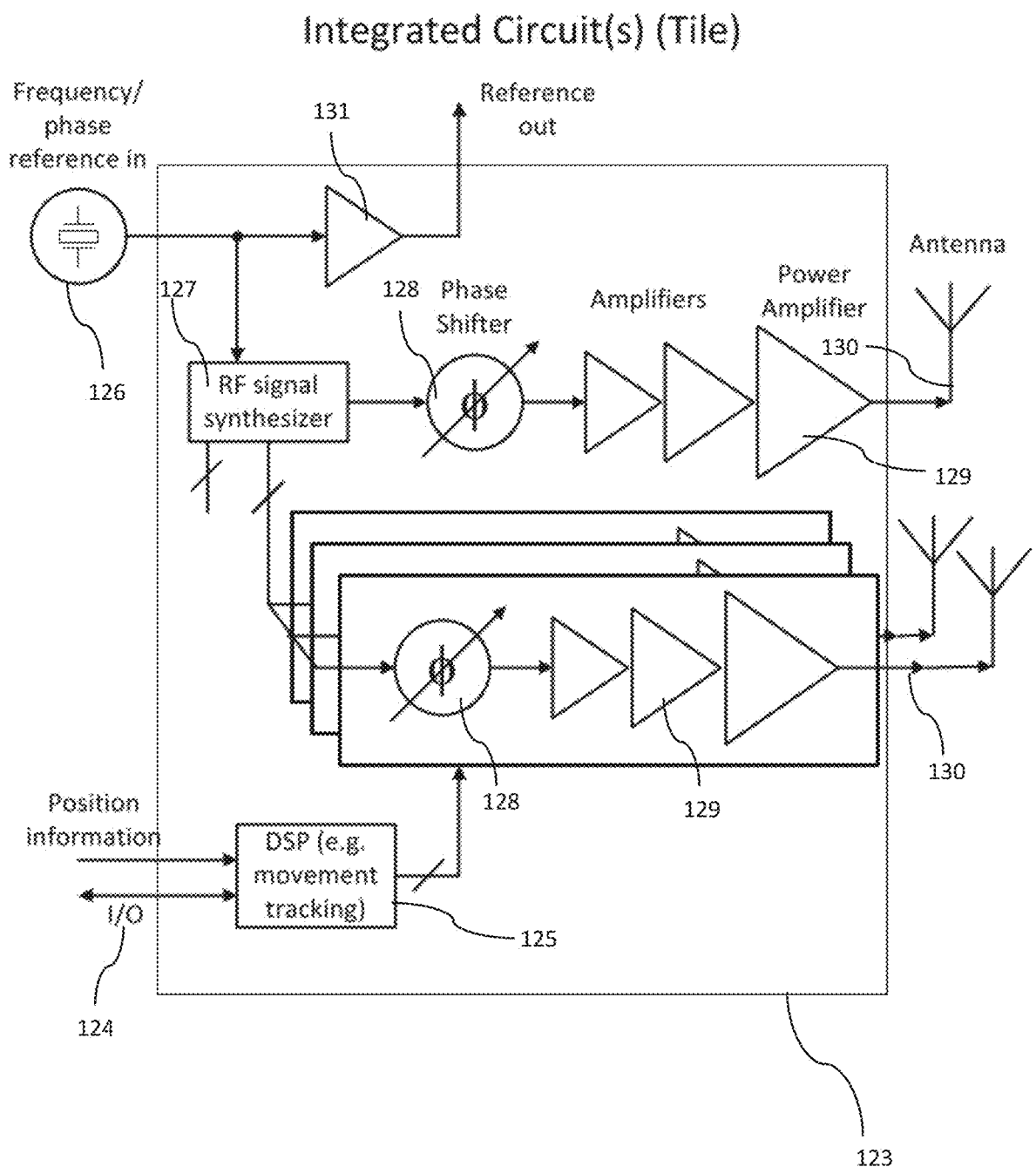
FIG. 4c conceptually illustrates a block-diagram for an integrated circuit suitable for utilization in a power transmitter forming part of a power generation tile, according to one embodiment.

In various embodiments, as illustrated conceptually in FIG. 4c, power generation tile control circuitry can be implemented using one or more integrated circuits. An integrated circuit 123 can include an input/output interface 124 via which a digital signal processing block 125 can send and receive information to communicate with other elements of a satellite module, which typically includes a processor and/or memory configured by a control application. In certain embodiments, the digital signal processing block 125 receives location information (see discussion above) that can be utilized to determine the location of one or more antennas. In many embodiments, the location information can include a fixed location and/or one or more relative locations with respect to a reference point. The digital signal processing block can utilize the received location information and/or additional information obtained from any of a variety of sensors including (but not limited to) temperature sensors, accelerometers, and/or gyroscopes to determine the position of one or more antennas. Based upon the determined positions of the one or more antennas, the digital signal processing block 125 can determine a phase offset to apply to a reference signal 126 used to generate the RF signal fed to a specific antenna. In the illustrated embodiment, the integrated circuit 500 receives a reference signal 126, which is provided to an RF synthesizer 127 to generate an RF signal having a desired frequency. The RF signal generated by the RF synthesizer 127 is provided to one or more phase offset devices 128, which are configured to controllably phase shift the RF signal received from the RF synthesizer. The digital signal processing block 125 can generate control signals that are provided to the phase offset device(s) 128 to introduce the appropriate phase shifts based upon the determined location(s) of the one or more antennas. In many embodiments, the amplitude of the generated signal can be modulated and/or varied alone or in conjunction with the phase appropriately upon the determined locations to form the power beam and/or focused transmission. The amplitude can be modulated in variety of ways such as at the input of a power amplifier chain via a mixer or within an amplifier via its supply voltage, an internal gate or cascode biasing voltage. As can readily be appreciated, any of a variety of techniques appropriate to the requirements of a specific application can be utilized to amplitude modulate an RF signal in accordance with various embodiments of the invention. The phase shifted RF signals can then be provided to a series of amplifiers that includes a power amplifier 129. While the entire circuit is powered by the electric current generated by the PV component(s) of the power generation tile, the power amplifier is primarily responsible for converting the DC electric current into RF power that is transmitted via the RF signal. Accordingly, the power amplifier increases the amplitude of the received phase shifted RF signal and the amplified and phase shifted RF signal is provided to an output RF feed 130 connected to an antenna. In many embodiments, the RF signal generated by the RF synthesizer is provided to an amplifier 131 and distributed to the control circuitry of other tiles. The distribution of reference signals between tiles in a module in accordance with various embodiments of the invention is discussed further below.

Although specific integrated circuit implementations are described above with reference to FIG. 4c, power generation tile control circuitry can be implemented using any of a variety of integrated circuits and computing platforms in accordance with various embodiments. Furthermore, satellite modules can be implemented without providing computational capabilities on each power generation tile and/or without utilizing the computational capabilities of a power generation tile to determine locations and/or phase shifts for the purposes of generating an RF signal to feed a power generation tile antenna. Power amplifier configurations and the use of power amplifiers with power connections connected in series in combination with control circuitry to control the operating characteristics of the power amplifiers in accordance with various embodiments of the invention are discussed further below. As noted above, these power amplifier configurations can be utilized in power generation tiles in accordance with a number of embodiments of the invention.

Efficient Power Amplifier Configurations

Figure 5A:
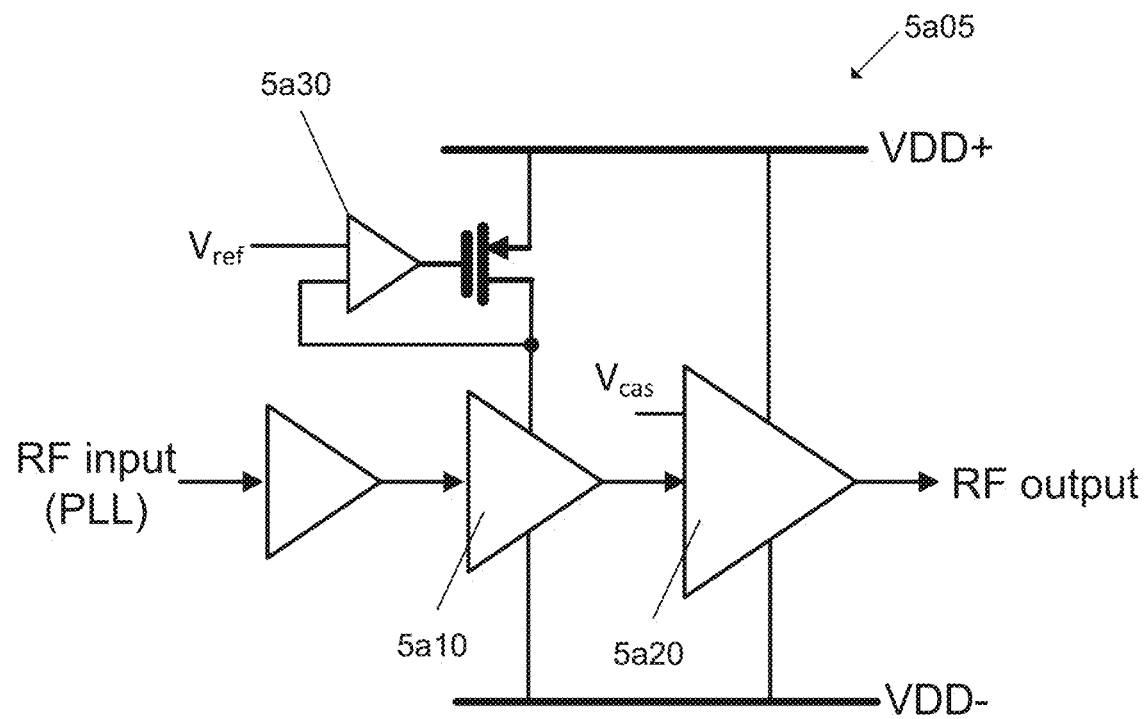
FIG. 5a conceptually illustrates a block diagram of a driver and power amplifier chain in accordance with an embodiment of the invention.
Figure 5B:
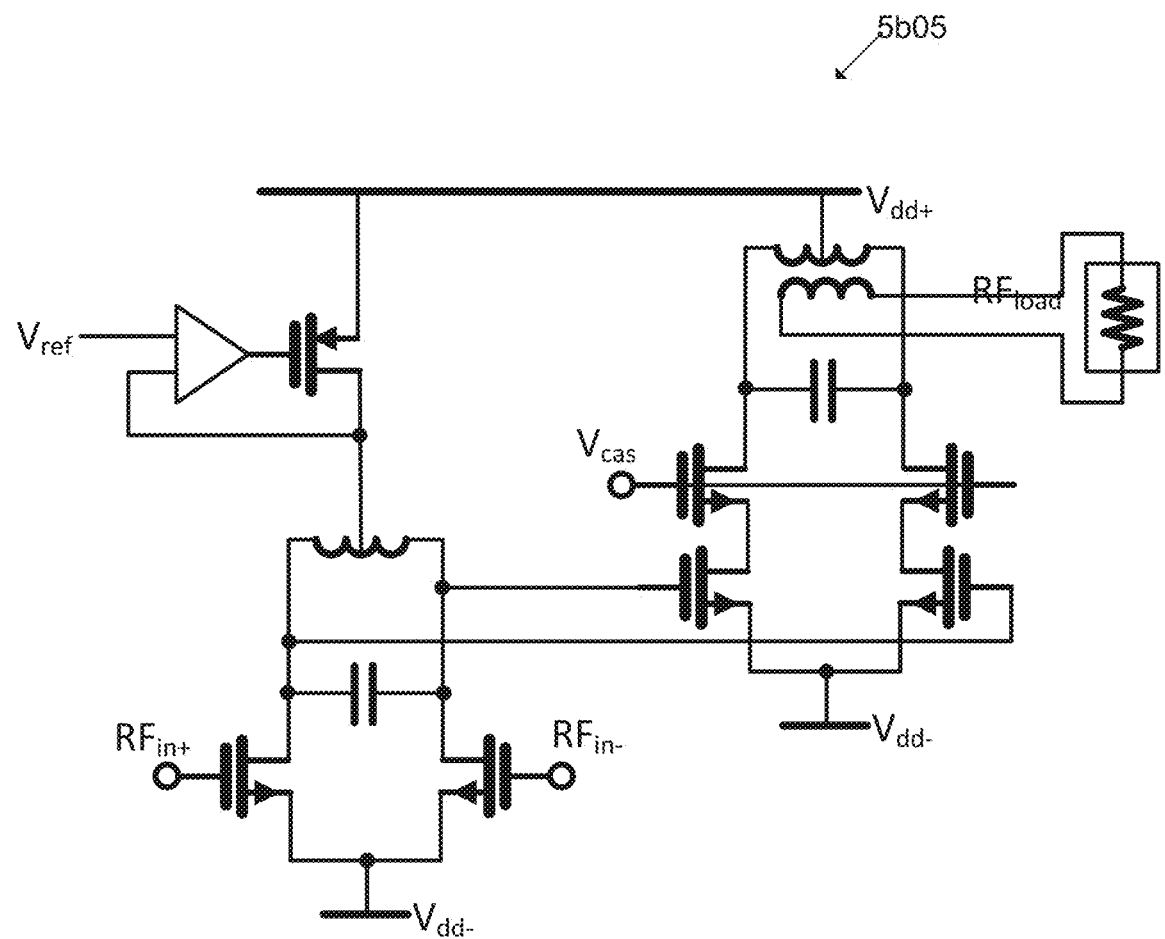
FIG. 5b conceptually illustrates a driver and power amplifier at a device level in accordance with an embodiment of the invention.

Many embodiments of the invention use multiple power amplifiers with supply connections connected in series in order to convert DC electric current into RF power that can be transmitted via an RF signal. An example of a power amplifier circuit design used to generate power in accordance with an embodiment of the invention is illustrated in FIG. 5a. In particular, FIG. 5a illustrates a block diagram of a driver and power amplifier chain 5a05. FIG. 5b illustrates the driver and the power amplifier illustrated in FIG. 5a at a device level 5b05, where the two amplification stages shown correspond to the stages 5a10 and 5a20 shown in FIG. 5a. FIG. 5a also illustrates a regulator 5a30 that can regulate the gate bias voltage of the power amplifier stage through a transformer midpoint node. In some embodiments, the VDD+/− are allowed to be floating in order to stack stages in a way where the Vdd− of a "top" stage is connected electrically to the Vdd+ of a "bottom" stage. Although not illustrated in FIG. 5a, certain embodiments may also include one or more current sensors and/or voltage sensors in order to monitor the power amplifier(s).

Figure 5C:
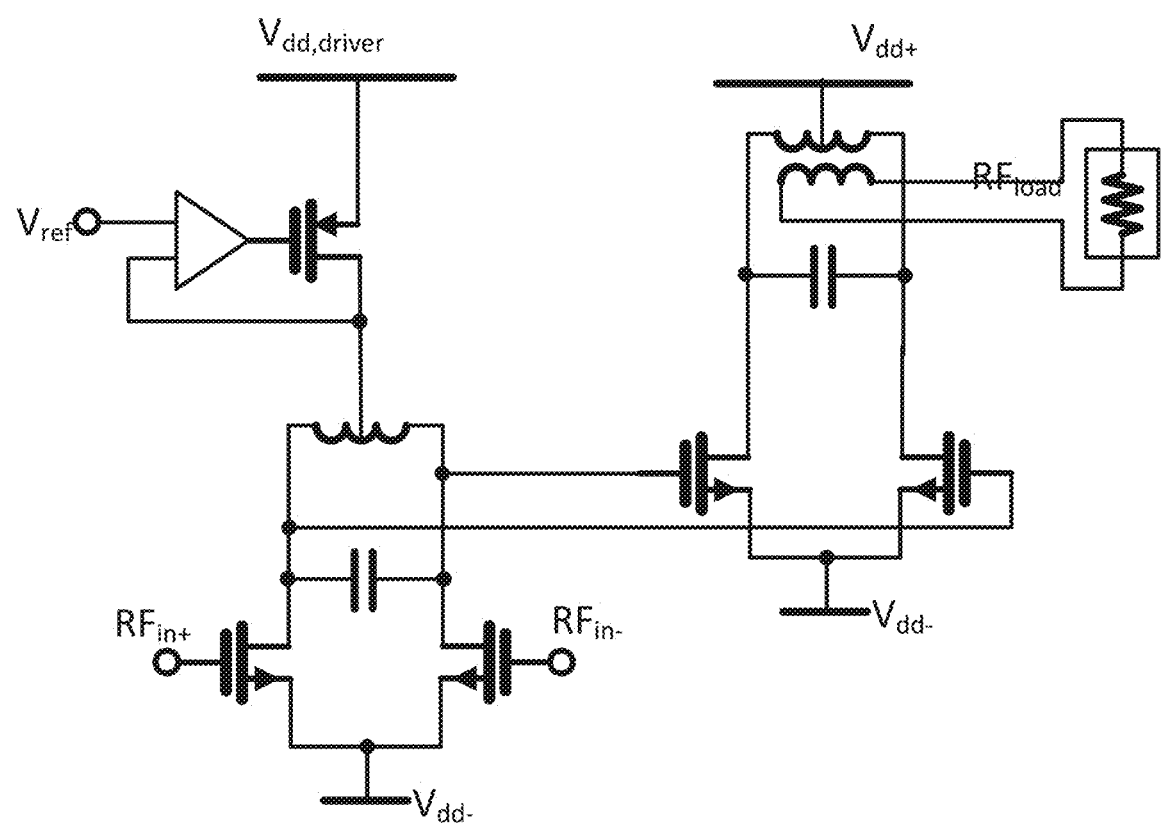
FIG. 5c conceptually illustrates a power amplifier circuit design that achieves power control by adjusting core bias voltage in accordance with an embodiment of the invention.

Output power, DC current consumption and peak voltages of the power amplifier may also be controllable via the gate bias, base bias or similar for a power amplifier core not incorporating a cascode device. An example of power amplifier circuit design that achieves power control by adjusting core bias voltage in accordance with an embodiment of the invention is illustrated in FIG. 5c. In some embodiments, the power amplifier circuit may also incorporate, though not always necessary, a possible separate positive supply rail for the driver stage for cases where the local driver supply may need to be higher than the local power amplifier supply rail (for example to account for a DC voltage drop across the regulator). This supply can be derived from the local power amplifier supply such as by using a charge pump, a DC-DC upconverting regulator or similar technique to increase the level of Vdd, driver compared to the level of Vdd+.

As discussed further below, signals obtained using current and/or voltage sensors can be utilized by control circuitry to control the operating characteristics of the amplifiers with the goal of increasing the efficiency of the amplifiers and/or preventing circuit damage associated with overcurrent and/or voltage conditions. Furthermore, although not illustrated in FIG. 5a, some embodiments may use a bypass device to allow additional current to flow from Vdd+ to Vdd−.

In many embodiments of the invention, a power amplifier configuration is utilized in which the supplies of multiple power amplifiers (or other suitable circuits) are connected in series, and thus the current through the power amplifiers is electrically forced to be the same. However, without any additional means of control, the intermediate supply voltages or, in other words, the way the supply voltage is divided across the amplifier chain, may adjust electrically to equalize the current through all amplifiers. This can result in a particular amplifier having across it too high of a supply voltage such that peak voltages encountered across the amplifying transistors and devices can be too high. A condition in which a supply voltage exceeds a safe threshold can occur when a particular amplifier sees a load mismatch condition that tends to reduce its DC current consumption (typically when the amplifier load is too low, or the equivalent resistance of that load is too large). Compounding this condition is the fact that such a load mismatch tends to increase the voltage stresses experienced by the amplifying devices even if the supply voltage stays constant (e.g., the ratio of peak voltage to average—or DC—voltage increases).

Accordingly power amplifier configurations in accordance with several embodiments of the invention include control circuitry that senses the operational characteristics of the power amplifiers and adjusts the current drawn by one or more of the power amplifiers to prevent any of the power amplifiers from experiencing over voltage stresses and/or to increase the operational efficiency of the power amplifiers. In particular, the control circuitry can be configured to increase the current drawn by a power amplifier. In a number of embodiments, the current drawn by one or more of the power amplifiers can be increased by modifying the so-called bias voltages of the transistors within the power amplifiers, such as (but not limited to) gate bias (see e.g., FIG. 7), base bias and/or cascode bias voltage (see e.g., FIG. 6). In many embodiments, the control circuitry can include dedicated bypass devices that provide a path to bypass current around a specific power amplifier (see e.g., FIG. 8).

Figure 6:
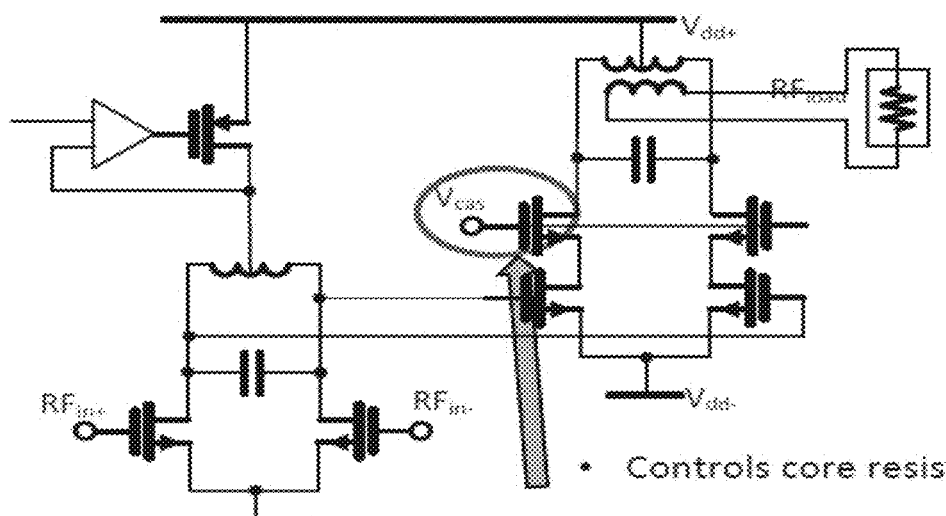
FIG. 6 conceptually illustrates controlling power amplifier operations using cascode voltage in accordance with an embodiment of the invention.

In several embodiments, the power amplifier configurations use cascode voltage and gate input bias control to control the operation of the power amplifier. An example of controlling power amplifier operation using cascode voltage in accordance with an embodiment of the invention is illustrated in FIG. 6, whereby the Vcas signal is controlled to control the core resistance of the power amplifier stage. This, in turn, may affect the current drawn by the stage, in addition to output power produced and peak voltages across devices encountered. Typically, when an amplifier is drawing too much current, it may produce too much output power and regulation of the cascode voltage can lower both. The same may be true for too little current drawn, typically.

Figure 7:
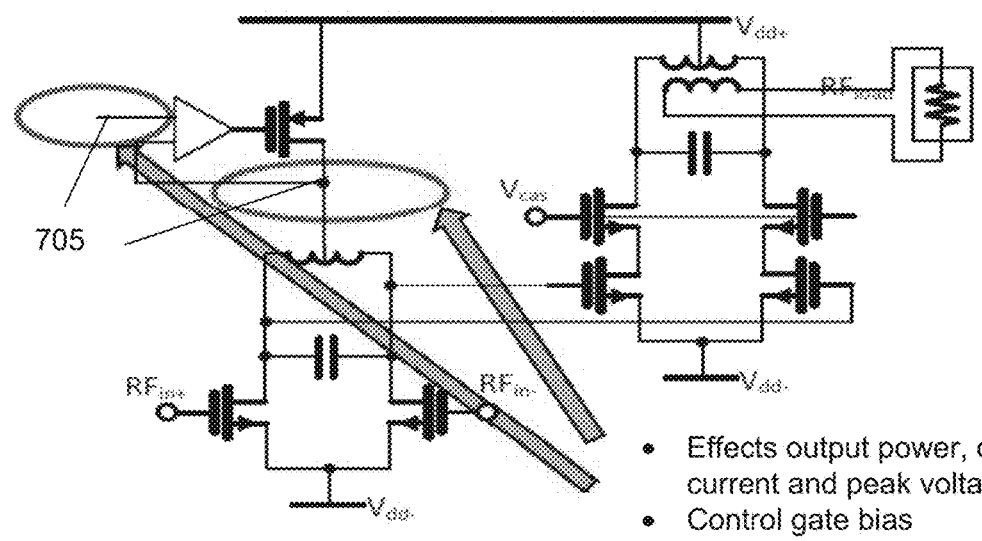
FIG. 7 conceptually illustrates controlling a power amplifier via a driver and/or gate bias in accordance with an embodiment of the invention.

An example of controlling a power amplifier via a driver and/or gate bias in accordance with an embodiment of the invention is illustrated in FIG. 7. As illustrated, the gate bias 705 may be used in order to control the power amplifier. Just as a cascode voltage can be used to lower and raise the dc current drawn by the power amplifier, so can a gate bias, base voltage or similar control voltage with effects similar to those described in the previous paragraph.

Figure 8:
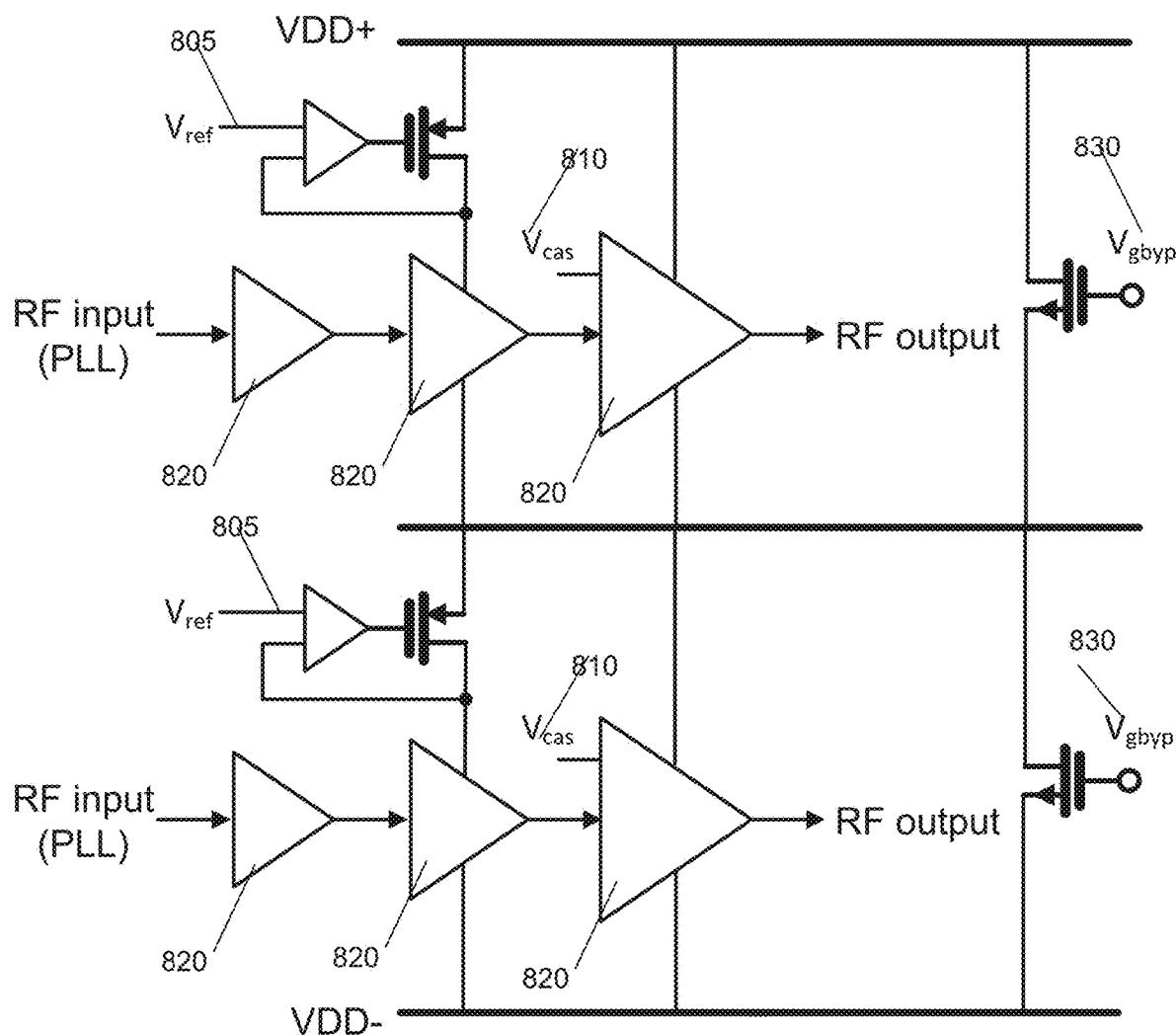
FIG. 8 conceptually illustrates controlling a supply current of a power amplifier using dedicated bypass devices in order to bypass current in accordance with an embodiment of the invention.

Certain embodiments of the invention may use FET bypass devices whose gate voltage can be programmed to allow the amplifier core to draw additional current from the supply (if a non-zero gate bias voltage is programmed). An example of controlling a supply current of a power amplifier using dedicated bypass devices in order to bypass current in accordance with an embodiment of the invention is illustrated in FIG. 8. The transistors being connected between the supply connections can be switched on with a known and possibly programmable bias to bypass a portion of the supply current from another stacked power amplifier to control the total supply current of the power amplifier and bypass combination. To lower the current drawn by a power amplifier stage, bias voltages such as the gate/base bias 805 of the amplifying transistor, or the cascode bias 810 can be reduced. The latter can also help with decreasing the peak voltages encountered by the various devices.

Certain embodiments of the invention may use analog peak voltage and DC current detectors whose output is a linear or otherwise known and suitable function of these quantities in addition to an offset prescribed (to gain sensitivity around values of interest). The output of these detectors may be converted by analog-to-digital converters (ADCs) and can be read by a microcontroller or other suitable digital logic to monitor the operation of the power amplifiers and provide digital feedback control. In addition, the supply voltage values of each power amplifier may also be converted by ADCs and can be read in by a microcontroller. The microcontroller can control the gate biases of the bypass device(s) 830, the gate biases 805 of the power amplifiers 820 and/or the cascode voltages 810 of the power amplifiers 820 via programmable digital registers and implemented digital-to-analog converters (DACs). Although FIGS. 6, 7, and 8 illustrate controlling power amplifier operations by controlling driver/gate bias, cascode voltage, and/or bypass devices, any of a variety of mechanisms may be used to control a power amplifier as appropriate for the requirements of specific applications in accordance with embodiments of the invention. Microcontroller configurations that can be used to control the operational characteristics of power amplifiers with supply connections connected in series in accordance with various embodiments of the invention are discussed further below.

Operation of the Controller

In several embodiments of the invention, the load seen by a power amplifier can be varied electrically to be brought closer to the nominal or ideal load by using tunable transmission lines, varactors, and/or outphasing techniques, among various other techniques. By monitoring the current and the peak voltage encountered across the amplifier, a signal processor, microcontroller, look-up table or other suitable means can be used to estimate the load current condition. In addition, temperature sensors and calibration data can be used to refine such an estimate based on the so-called process corner and operating temperature.

Figure 9:
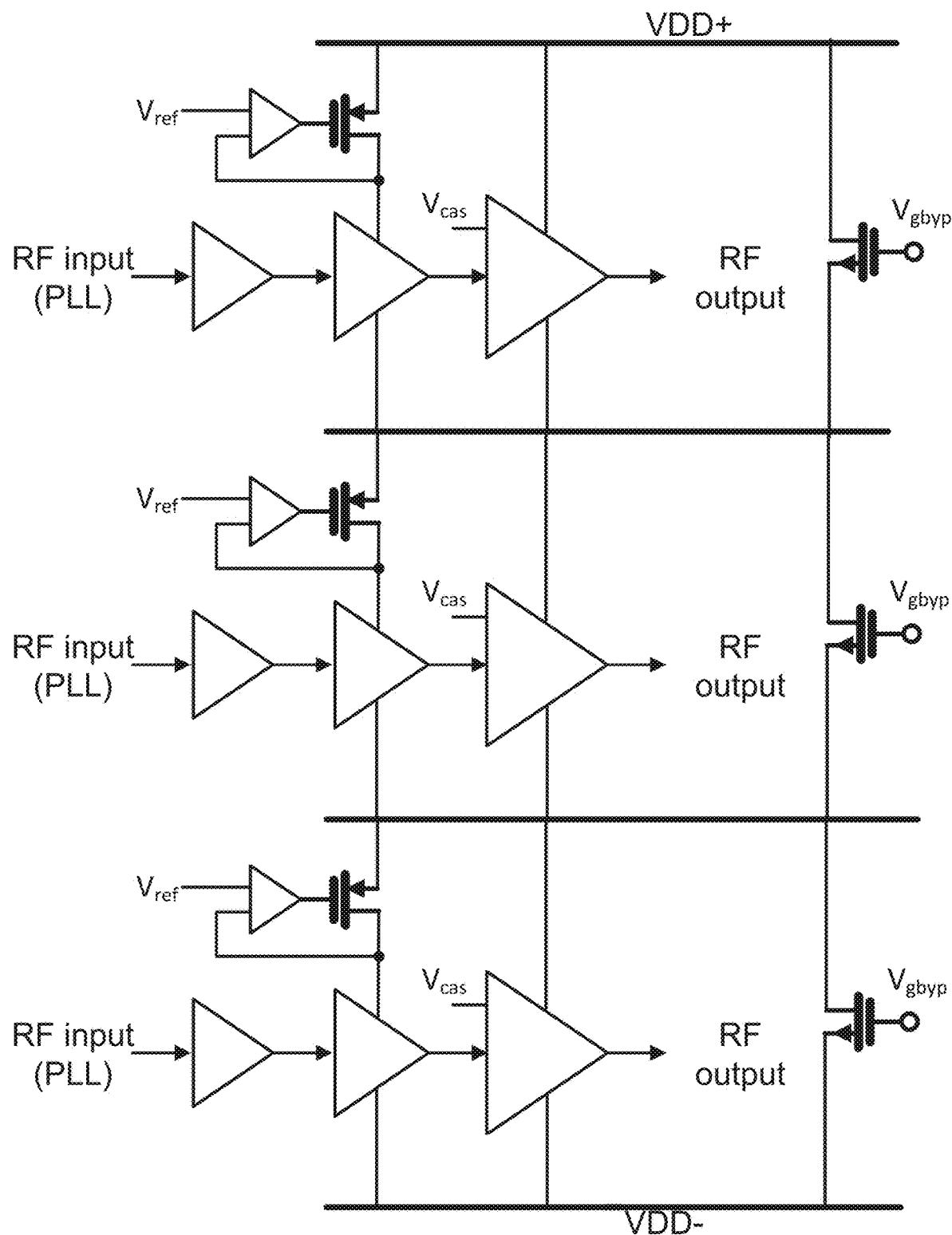
FIG. 9 conceptually illustrates a stack of three power amplifiers in accordance with an embodiment of the invention.

Several embodiments of the invention may be implemented using a stack of N amplifiers, (e.g., two, three, four, or N power amplifiers). Thereby a microcontroller may monitor and control the stacked cores to achieve increased efficiency and/or an optimal supply voltage distribution among the cores. In certain embodiments, the nominal supply may be 3.2V and the core nominal supply voltage is 0.8V (or 0.4V for non-cascode cores as shown in for example, FIG. 5c). Thus, each core may behave as it was a standalone core. An example of a stack of two power amplifiers in accordance with an embodiment of the invention is illustrated in FIG. 8. An example of a stack of three power amplifiers in accordance with an embodiment of the invention is illustrated in FIG. 9. In certain embodiments, a stack of two power amplifier cores designed to operate at 0.8V may be utilized in combination with a nominal 1.6V voltage supply. In several embodiments, a stack of four power amplifier cores designed to operate at 0.8V is utilized in combination with a nominal power supply of 3.2V. As can readily be appreciated, the specific manner in which power amplifier cores are stacked is largely dependent upon the requirements of a given application.

In certain embodiments, a microcontroller periodically records the values of signals received from DC current sensors, peak voltage sensors and/or supply voltage sensors across the stack of power amplifiers, and modifies output signals that can be provided to circuits including (but not limited to) to one or more of the gate biases of the bypass device(s), the gate biases of the power amplifiers and/or the cascode voltages of the power amplifiers. In a number of embodiments, the microcontroller can implement a PID (proportional-integral-derivative) or PSD (proportional-summation-difference) controller in software to determine the appropriate output signals to provide to control the operational characteristics of the stacked power amplifiers. As noted above, control can be exerted by controlling the gate bias voltages applied to transistors in current bypass circuits. Additional control can also be exerted via controlling bias voltages of the power amplifier including (but not limited to) the gate bias voltage (see e.g., FIG. 7) and/or the cascode bias voltage (see e.g., FIG. 6). In several embodiments, the PSD controller's objective is to equalize the values of all individual PA supply voltages in the stack. Additional monitoring of the peak voltage and DC current values can signal overstress conditions and allow the controller to down-regulate the operation of the affected power amplifier(s) to a safe operating condition. As can readily be appreciated, the specific implementation of the control process utilized by the microcontroller is largely determined by the requirements of a given application.

As described above, different embodiments may utilize different numbers of amplifiers in a stack. A stack of two amplifiers plus bypass devices that can increase the current consumption in accordance with an embodiment of the invention is illustrated in FIG. 8. The nodes Vref 805 (PA gate bias; driver supply voltage), Vcas 810 (cascode voltage) and Vgbyp 830 (gate bypass voltage to increase core current consumption) may be set by digital-to-analog converters.

Figure 10:
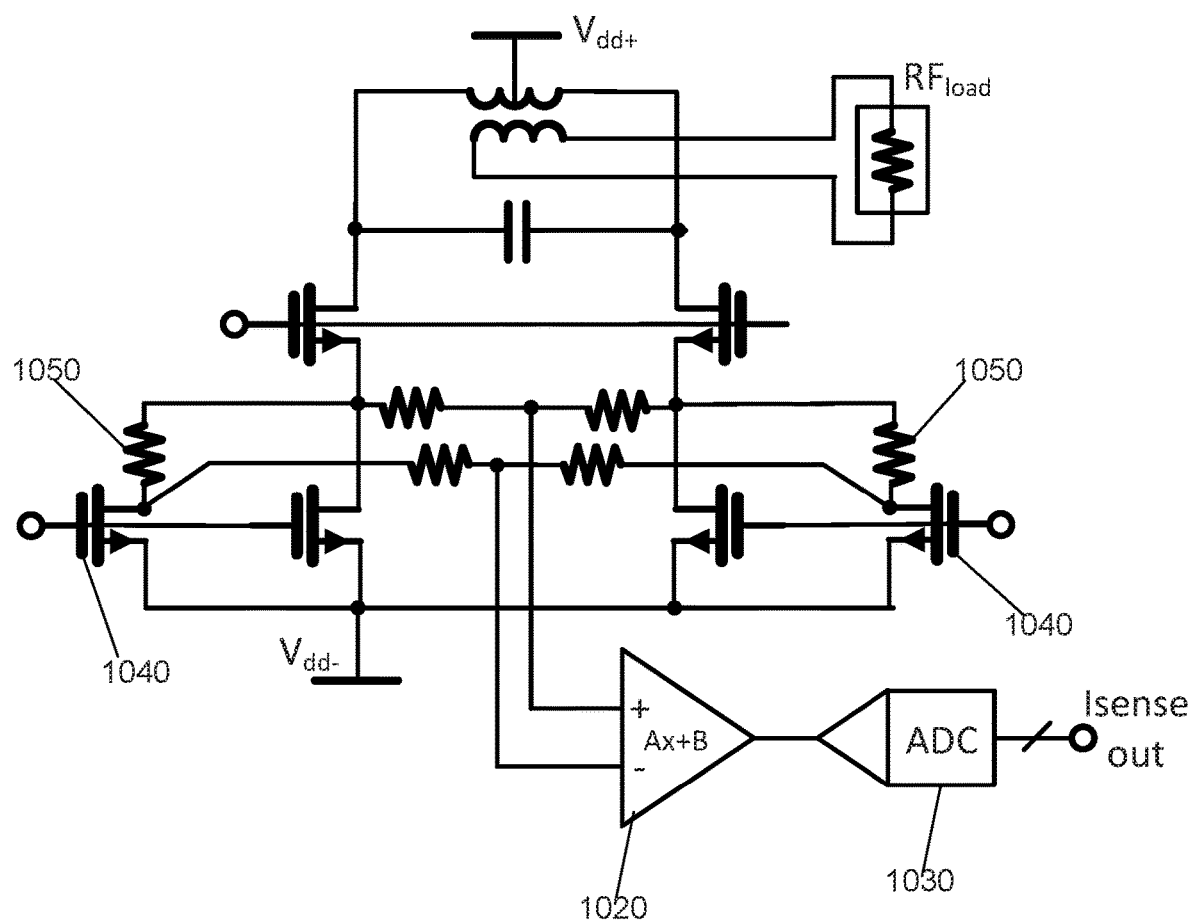
FIG. 10 conceptually illustrates the last stage of the PA plus the additional devices for current sensing, and includes replica transistors, sense and bias resistors, gain amp, and ADC in accordance with an embodiment of the invention.

FIG. 10 illustrates the last stage of the PA plus the additional devices for current sensing, and includes replica transistors, sense and bias resistors, gain amp 1020, and ADC 1030 in accordance with an embodiment of the invention. The replica devices 1040 connect to a suitably small sense resistor and are meant to replicate a proportion of the total current drawn by the main devices. This current may then be sensed via amplifying (using 1020) and measured (using ADC 1030) the DC voltage across the sense resistors 1050.

Figure 11A:
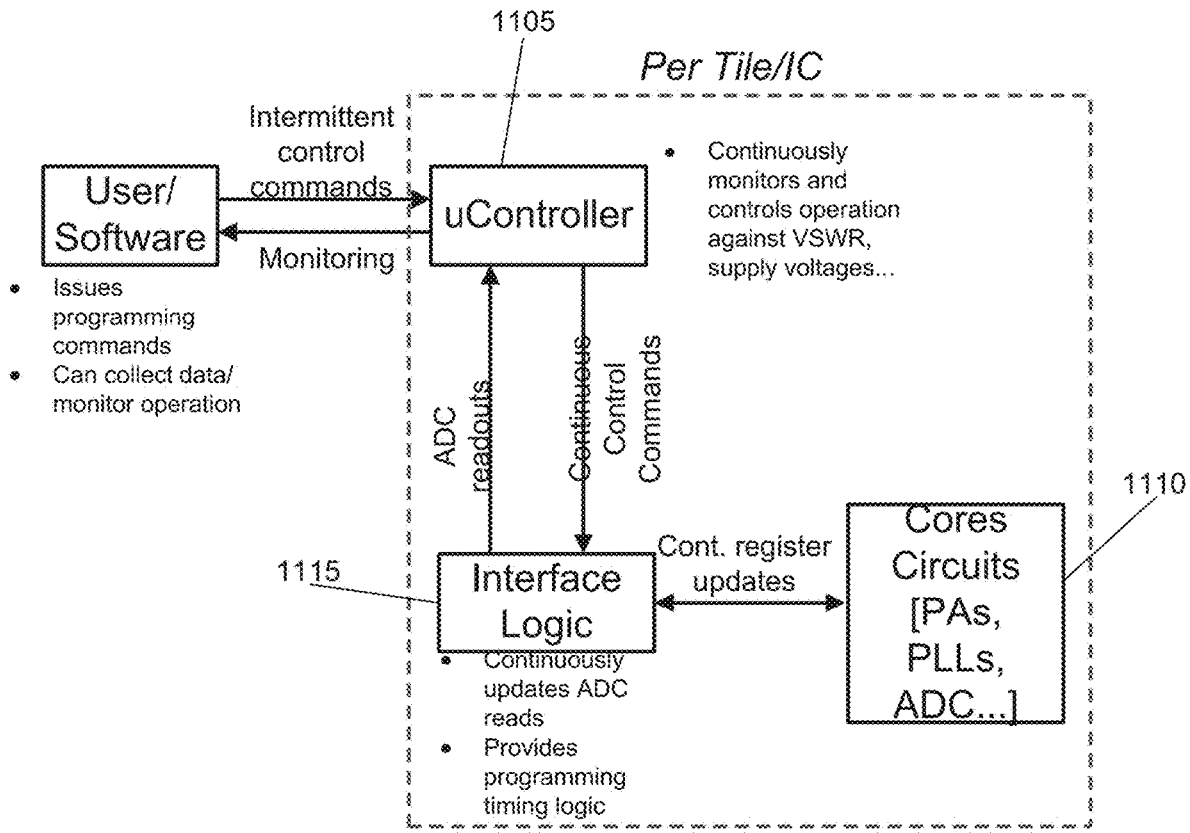
FIG. 11a conceptually illustrates a microcontroller and digital interface for monitoring and controlling operations of a stack of power amplifiers in accordance with an embodiment of the invention.
Figure 11B:
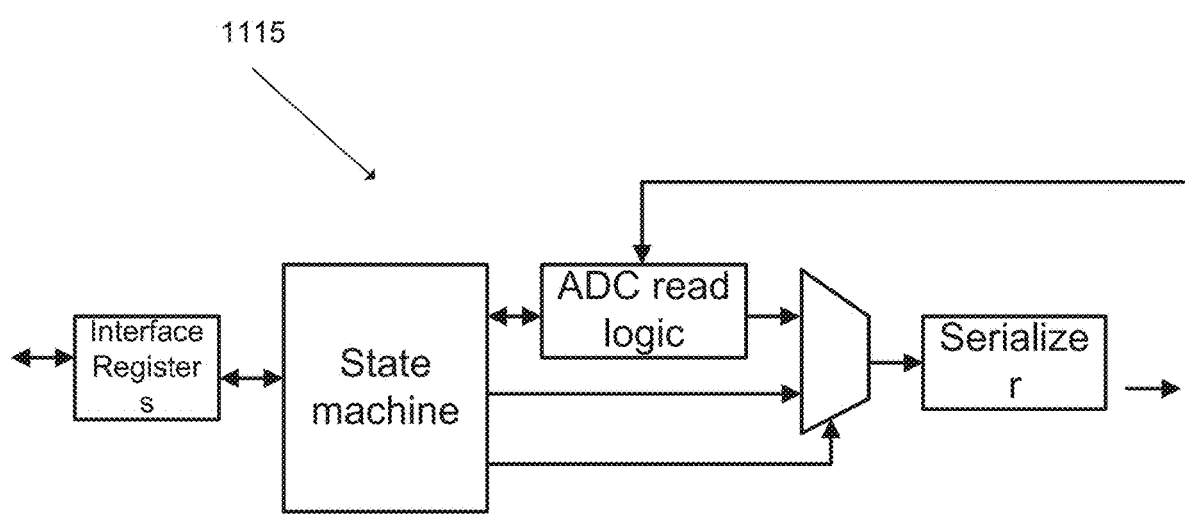
FIG. 11b illustrates details of an Interface Logic in accordance with an embodiment of the invention.

Additional benefits can be derived by providing a microcontroller or similar digital processing power that can monitor and adjust the operation of the power amplifiers to ensure that operation in a stacked configuration in which the supply connections are connected in series does not result in harm to any of the individual power amplifier cores and/or can increase operating efficiency of the stacked power amplifiers. An example of a microcontroller and digital interface for monitoring and controlling operations of a stack of power amplifiers in accordance with an embodiment of the invention is illustrated in FIG. 11a. In particular, FIG. 11a illustrates a microcontroller 1105 ("uController") interacting with one or more integrated power amplifiers 1110 in accordance with an embodiment of the invention. In some embodiments, the uController 1105 is used to automatically read digital sensor outputs and programs bypass transistor(s) to increase core current. In certain embodiments, PS(D) controllers implemented in software may keep core voltages at mid-points between any two core pairs. FIG. 11b illustrates more details of the Interface Logic illustrated 1115 of FIG. 11a in accordance with an embodiment of the invention. In certain embodiments, the Interface Logic 1115 may not be implemented, and instead, the microcontroller 1105 can directly program, control and read the ADCs, DACs and registers 1110 on the integrated circuit(s). Certain embodiments utilized in tiles of satellite modules and or SBSPs, where there is a microcontroller per tile, may use another computer device (e.g., running MATLAB, Arduino and/or Raspberry Pi, or a prototyping, small computer or even a computer included to control other aspects of the SBSP's operation such as flight and attitude control) to communicate (e.g., via SPI interface) to the various microcontrollers. Although FIG. 11a illustrates a microcontroller for controlling operations of power amplifiers, any of a variety of control mechanisms may be utilized as appropriate to the requirements of specific application.

Figure 12:
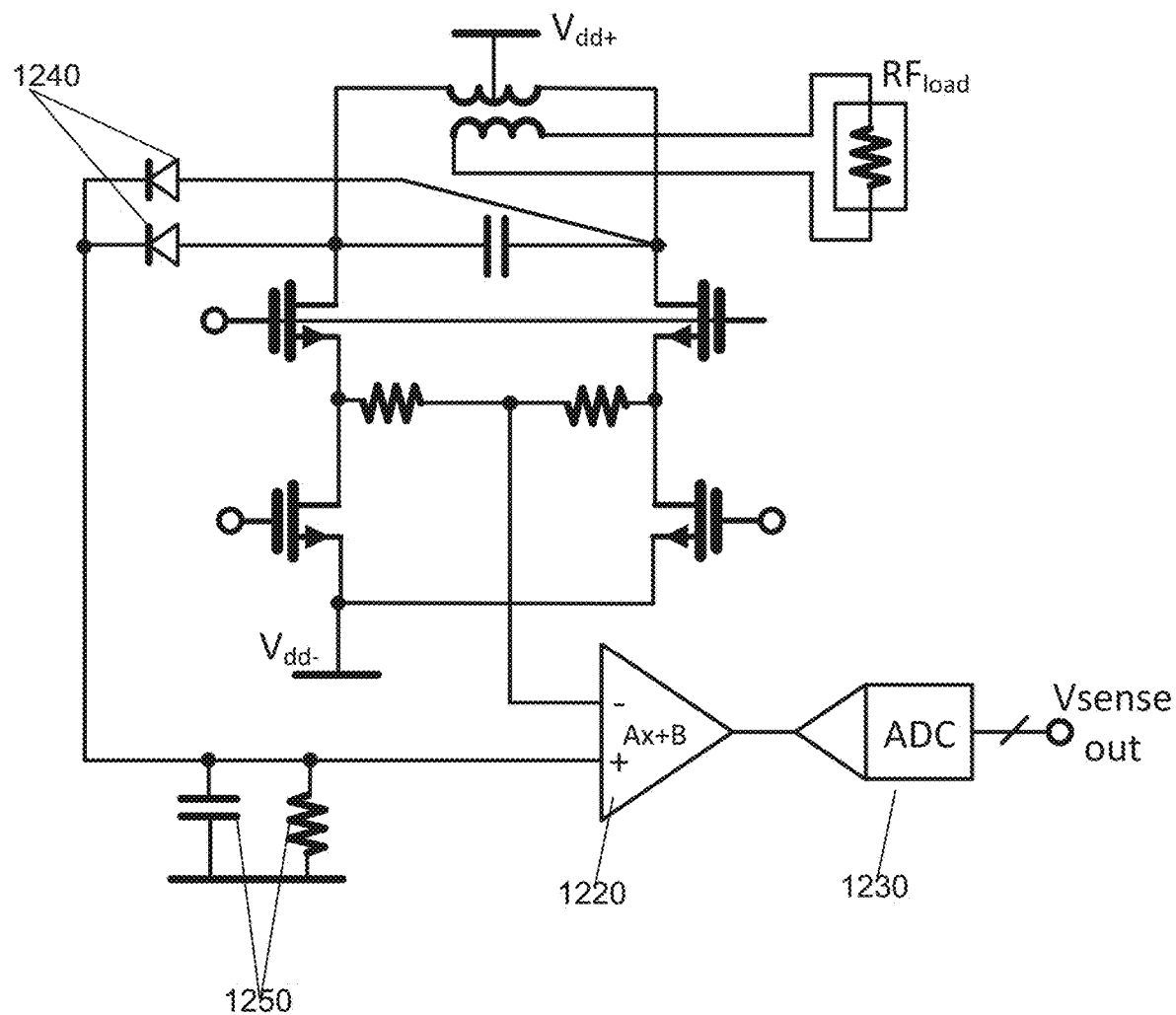
FIG. 12 conceptually illustrates a peak voltage detector as implemented and the PA core devices in accordance with an embodiment of the invention.

Certain embodiments may use the current sensor and peak voltage sensor inputs to further help monitor operation, but for supply voltage equalization, these may be optional. Furthermore, use of a peak voltage detector may help further optimize the operations of a stack power amplifier stack. An example of a peak voltage detector as implemented and the PA core devices in accordance with an embodiment of the invention is illustrated in FIG. 12. In particular, FIG. 12 illustrates the additional resistors and transistors, gain amp 1220, and ADC 1230 in accordance with an embodiment of the invention, as well as nominal diode devices 1240 that detect and convert the peak voltage to a DC output voltage further filtered and possibly modified by low pass filter 1250. By comparing and amplifying the difference between this peak voltage at the drain of the cascode device to the DC voltage at the source of the cascode device supplied to the negative input of amplifier 1220, the difference can be detected and converted to digitally usable information, for example by ADC 1230. Although FIG. 12 illustrates an example circuitry for a particular peak voltage detector across a particular device, any of a variety of circuit designs may be utilized to implement current and voltage sensors and detectors as appropriate to the requirements of specific applications in accordance with various embodiments of the invention. Note that the peak voltage across the entire amplifier can also be deduced since the peak voltage across the lower amplifying devices is fixed by the applied cascode voltage. Processes for controlling the operational characteristics of power amplifiers in accordance with various embodiments of the invention are discussed further below.

Power Amplifier Operational Control Processes

Figure 13:
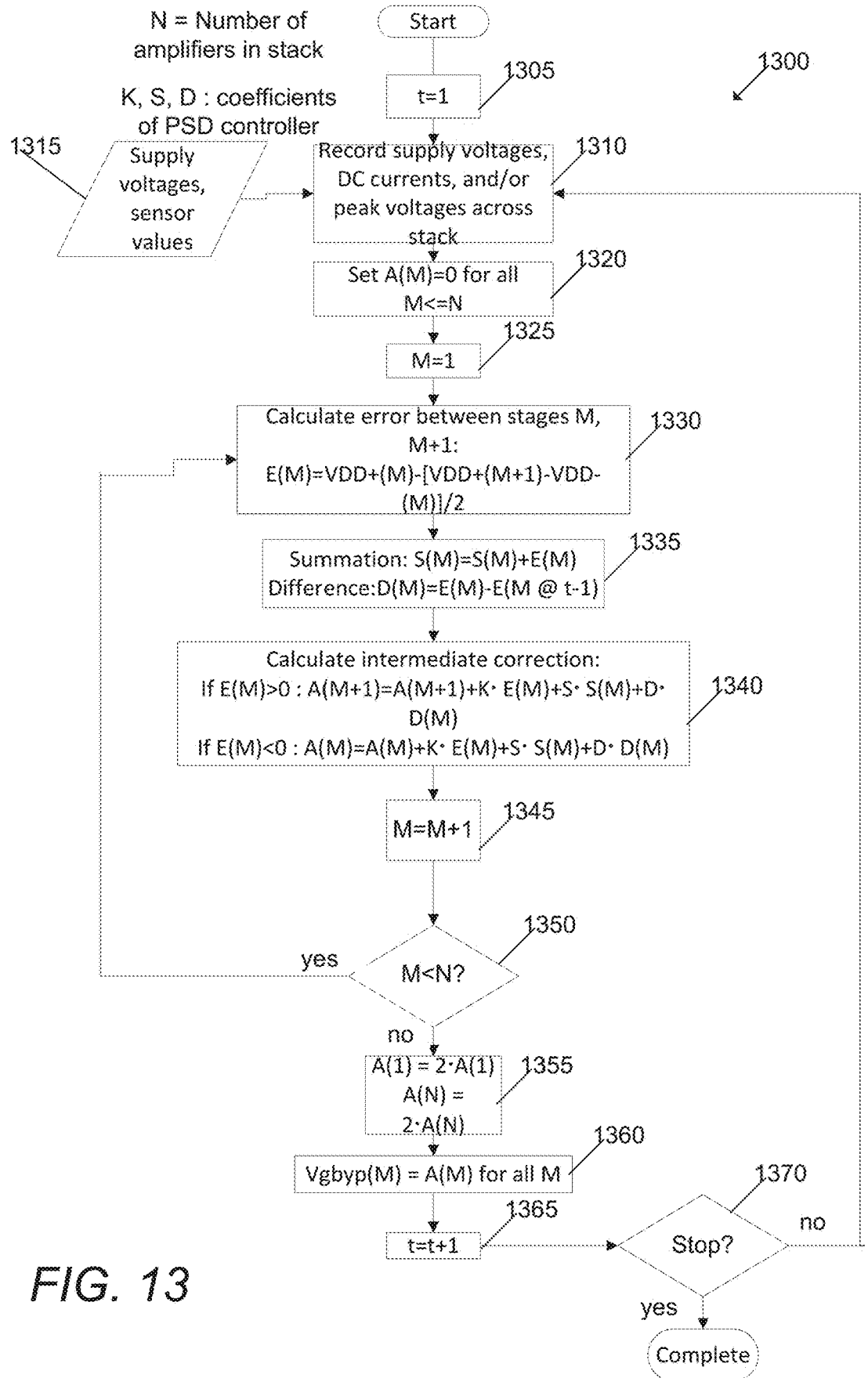
FIG. 13 conceptually illustrates a process that may be implemented in a microcontroller for controlling power amplifier operations.
Figure 14:
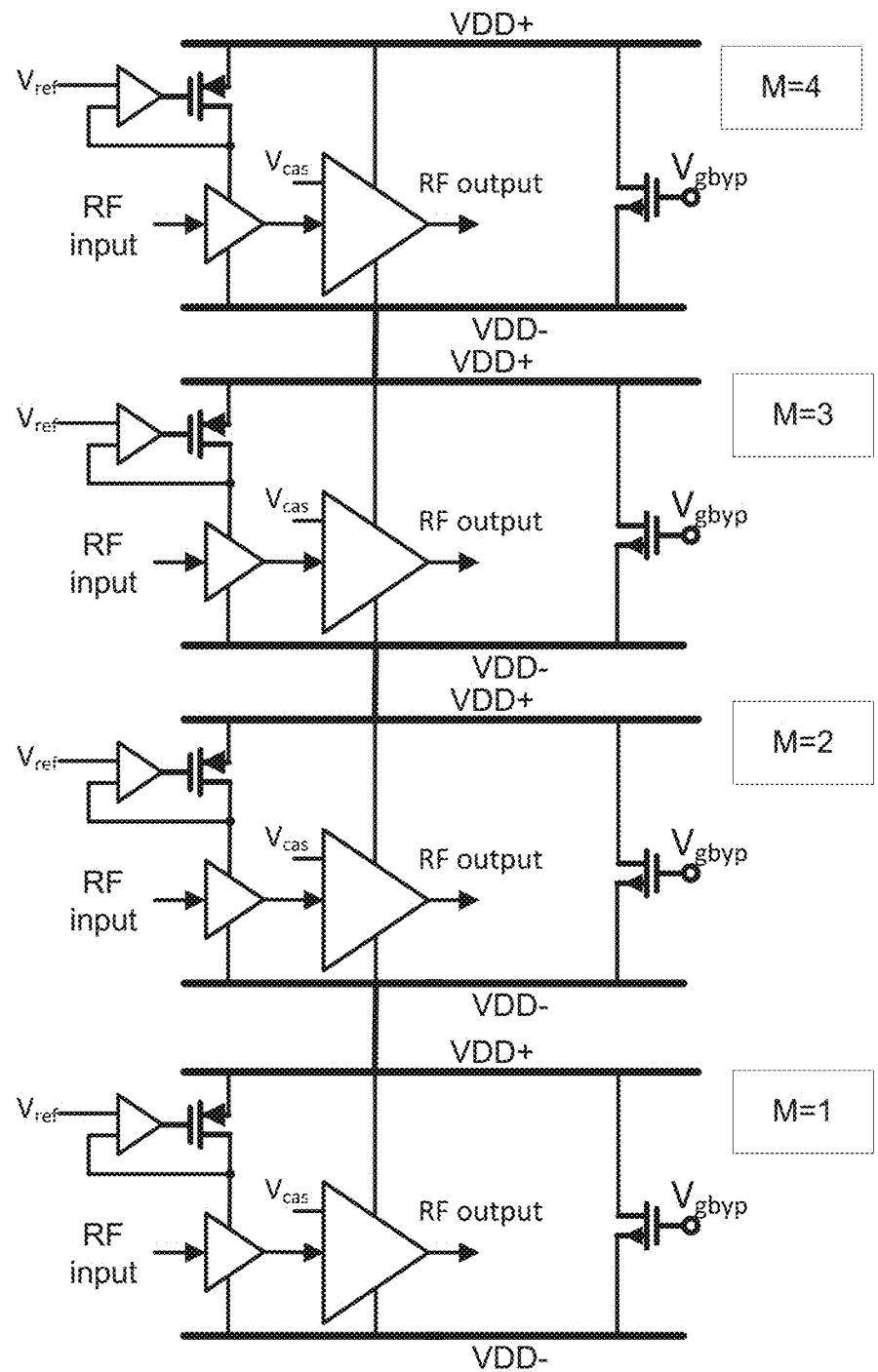
FIG. 14 conceptually illustrates an example of the stage numbering for the process illustrated in FIG. 13.

In order to control the operational characteristics of one or more power amplifiers, certain embodiments may utilize a microcontroller that obtains data from one or more sensors regarding the operation of the power amplifiers and based thereon, controls the supply voltage provided to one or more power amplifiers. FIG. 13 illustrates a process 1300 that may be implemented in a microcontroller for controlling power amplifier operations. In particular, the process is used to modify the current drawn (as well as supplied) by and to an amplifier based on the voltage readings at the different intermediate supply nodes. In particular, when a voltage between two adjacent stages is below the half-point, the bypass device of the upper of the two stages is increased as to conduct more current and bring the voltage up. If the voltage between two adjacent stages is above the half-point, the other bypass device is activated. FIG. 14 illustrates an example of the stage numbering for the process illustrated in FIG. 13. Note that for N=stages, the central loop will make three such comparisons between all three adjacent pairs.

As illustrated in FIG. 13, the process initializes (at 1305) t=1. The variables include N, number of amplifiers in the stack, and K,S, and D, which are coefficients of a PSD controller. The process records (at 1310) supply voltages, DC currents, and/or peak voltages across the stack of amplifiers. In some embodiments, the process reads (at 1315) supply voltages and sensor values. The process proceeds with various computations (1320-1365) that may be iterated numerous times in order to modify the supply load of one or more amplifiers in the stack. The process then completes.

Figure 15:
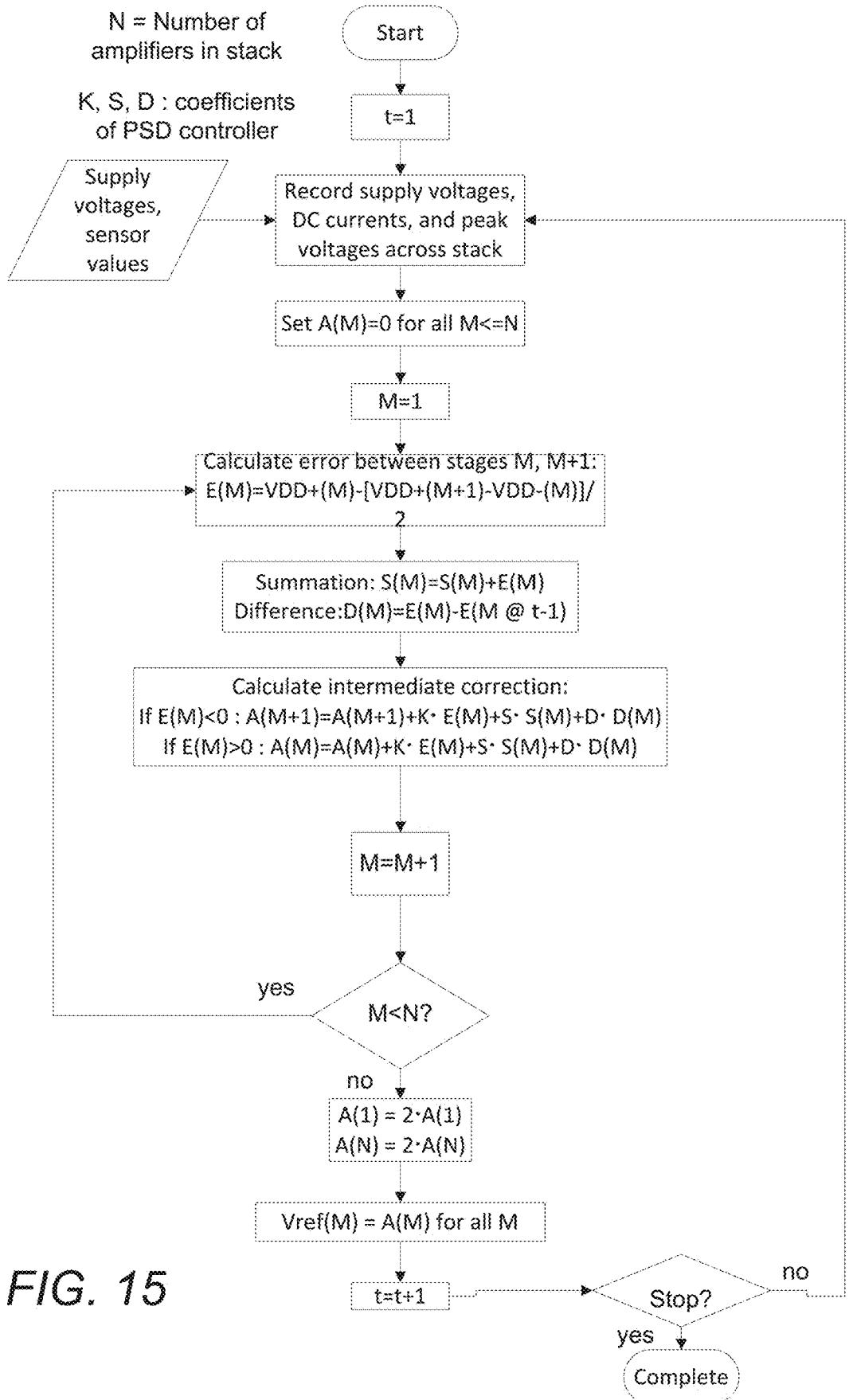
FIG. 15 illustrates another process, similar to the process illustrate in FIG. 13 that may be implemented for controlling power amplifier operations in accordance with an embodiment of the invention.
Figure 16:
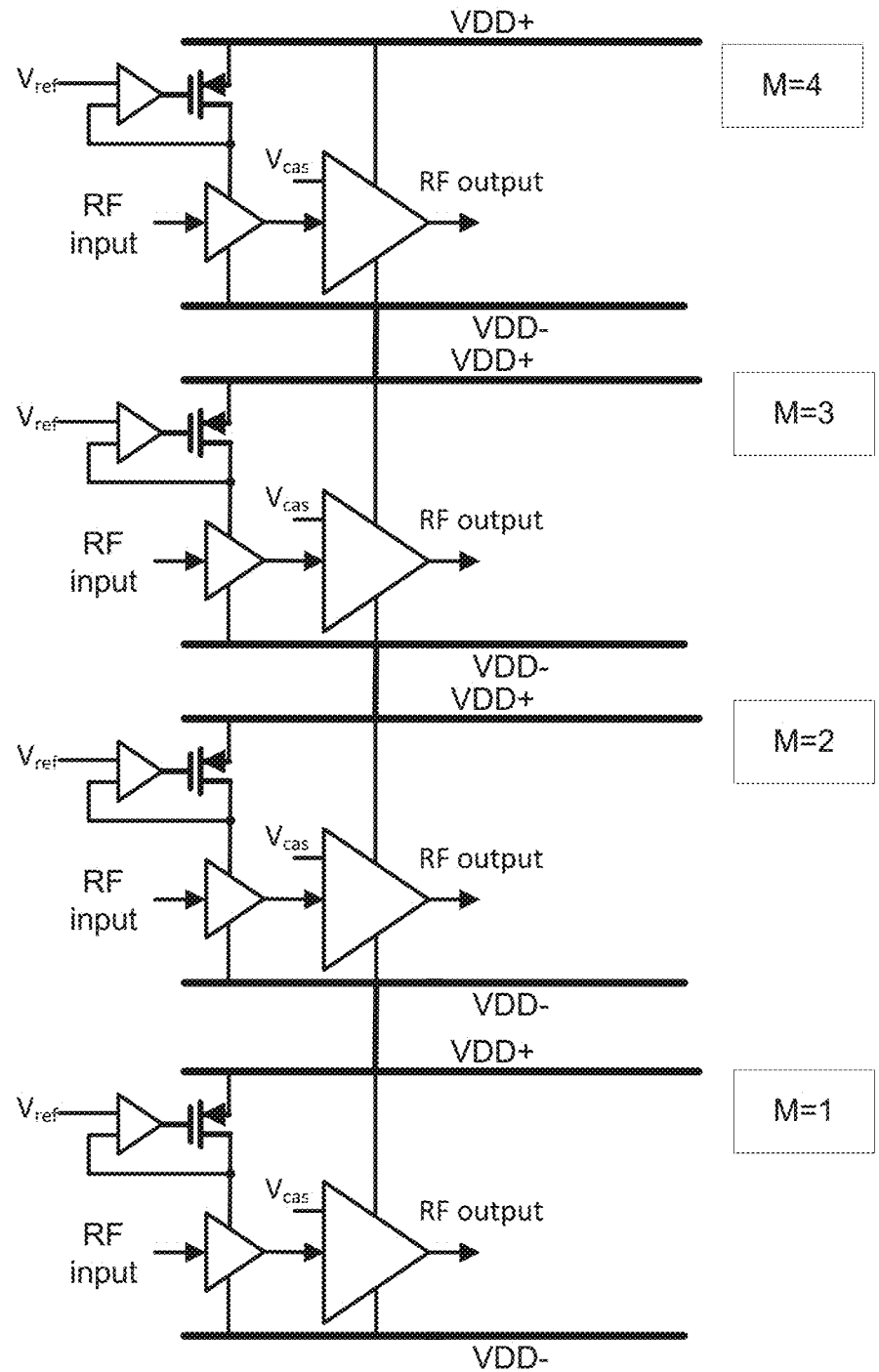
FIG. 16 illustrates a stack of four power amplifiers that correspond to the stages described in FIG. 15 in accordance with an embodiment of the invention.

FIG. 15 illustrates another process, similar to the process illustrate in FIG. 13 that may be implemented for controlling power amplifier operations in accordance with an embodiment of the invention. In the example illustrated in FIG. 15, the actuation is done on Vref, which is the gate bias of the output stage. In this case, when the voltage between two adjacent stages is below the half-point, the bias voltage of the lower of the two stages is decreased (assuming that the coefficients K and S are negative) so to reduce the current and bring the voltage up. Vice versa in the opposite case. For the difference, certain embodiments may utilize a memory of the previous error E(M @ t−1), which is kept if the difference is used. FIG. 16 illustrates a stack of four power amplifiers that correspond to the stages described in FIG. 15 in accordance with an embodiment of the invention. Furthermore, although FIG. 16 illustrates controlling supply voltages to the stack of power amplifiers via the Vref gate bias, any of a variety of other control mechanisms, such as (but not limited to) gate bias (see e.g., FIG. 7), base bias and/or cascode bias voltage (see e.g., FIG. 6) as appropriate to the requirements of specific applications. Furthermore, although specific processes are shown in FIG. 13 and FIG. 15, any of a variety of processes that sense the operational characteristics of power amplifiers and modify signals provided to circuitry within the power amplifier configuration to modify the operating characteristics of one or more of the power amplifiers can be utilized in accordance with various embodiments of the invention.

As described above, certain embodiments of the invention include power amplifiers that are implemented as cascode amplifiers. In several embodiments, the power amplifiers are implemented as a single device amplifier (e.g., Figure Sc). The single device amplifier can also be controlled in this manner, except there is no cascode voltage to be set. In this case, the driver supply voltage can be used to lower DC current consumption as well as peak voltages, while the bypass device can be used to increase the voltage. Furthermore, the technique is not limited to these particular amplifiers, rather any amplifier that has a bias input (e.g., gate bias, cascode bias or similar) that affects the supply current drawn can be regulated that way (e.g., by reducing/increasing the current). Certain embodiments are described above that only have increased currents, but the same technique and processes can be used whereby currents can be decreased or where currents may be both decreased and/or increased as an option.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. A circuit comprising:
   a plurality of power amplifiers having supply connections connected in series and used to convert electric current received via a supply connection into RF power that can be transmitted via an RF signal;
   one or more current sensors to monitor operating characteristics, including a supply current, of each power amplifier; and
   control circuitry configured to control each of the plurality of power amplifiers based on the operating characteristics of the plurality of power amplifiers, wherein the control circuitry further comprises a field-effect transistor (FET) bypass device that provides a path to bypass current around a specific power amplifier.

2. The circuit of claim 1, wherein the control circuitry adjusts a supply current drawn by one or more of the power amplifiers based on data derived from the one or more current sensors.

3. The circuit of claim 1, further comprising one or more voltage sensors that monitor the operating characteristics of the plurality of power amplifiers.

4. The circuit of claim 1, wherein the control circuitry increases a supply current drawn by a power amplifier.

5. The circuit of claim 1, wherein the control circuitry adjusts a supply current drawn by one or more of the power amplifiers by modifying bias voltages of transistors within the power amplifiers.

6. The circuit of claim 5, wherein the bias voltage is selected from a group consisting of a gate bias, a base bias, and a cascode bias.

7. The circuit of claim 1, wherein the one or more sensors comprises an analog peak voltage detector and a DC current detector.

8. The circuit of claim 1, wherein an output of the one or more sensors is converted by an analog-to-digital (ADC) converter.

9. The circuit of claim 1, wherein the control circuitry further comprises a microcontroller for monitoring the supply current.

10. The circuit of claim 9, wherein the microcontroller controls a magnitude of bias by performing a proportional-summation-difference (PSD) control process.

11. The circuit of claim 9, wherein the microcontroller controls the magnitude of bypass current by performing a PSD control process.

12. The circuit of claim 9, wherein the microcontroller controls the supply current using a proportional-integral-derivative (PID) process.

13. A control method for controlling supply voltages provided to a plurality of power amplifiers, the control method comprising:
monitoring operating characteristics, including a supply current, to each of a plurality of power amplifiers using one or more current sensors, wherein the plurality of power amplifiers have supply connections connected in series and are used to convert electric current received via a supply connection into RF power that can be transmitted via an RF signal;
controlling a supply current provided to each of the plurality of power amplifiers based on the operating characteristics of the plurality of power amplifiers wherein controlling the supply current comprises using a bypass device that provides a path to bypass current around a specific power amplifier.

14. The control method of claim 13, further comprising adjusting a supply current drawn by one or more of the power amplifiers based on data derived from the one or more current sensors.

15. The control method of claim 13, further comprising monitoring the operating characteristics of the plurality of power amplifiers using one or more voltage sensors.

16. The control method of claim 13, further comprising increasing a supply current drawn by a power amplifier.

17. The control method of claim 13, further comprising adjusting a supply current drawn by one or more of the power amplifiers by modifying bias voltages of transistors within the power amplifiers.

18. The control method of claim 17, wherein the bias voltage is selected from a group consisting of a gate bias, a base bias, and a cascode bias.

19. The control method of claim 13, wherein the one or more current sensors comprise an analog peak voltage detector and a DC current detector.

20. The control method of claim 13, wherein an output of the one or more sensors is converted by an analog-to-digital (ADC) converter.

21. A power generation tile, comprising:
at least one photovoltaic cell; and
at least one power transmitter collocated with the at least one photovoltaic cell and in signal communication therewith such that an electrical current generated by collection of solar radiation by the at least one photovoltaic cell powers the at least one power transmitter, where each of the at least one power transmitters comprises:
a plurality of power amplifiers having supply connections connected in series and used to convert electric current received via a supply connection into RF power that can be transmitted via an RF signal; and
control circuitry configured to control a supply voltage provided to each of the plurality of power amplifiers based on operating characteristics of the plurality of power amplifiers, wherein the control circuitry further comprises a field-effect transistor (FET) bypass device that provides a path to bypass current around a specific power amplifier.

* * * * *